United States Patent
Seo et al.

(10) Patent No.: US 7,554,174 B2
(45) Date of Patent: Jun. 30, 2009

(54) BIPOLAR TRANSISTOR HAVING SEMICONDUCTOR PATTERNS FILLING CONTACT WINDOWS OF AN INSULATING LAYER

(75) Inventors: Young-Dae Seo, Seoul (KR); Bong-Gil Yang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 387 days.

(21) Appl. No.: 11/337,505

(22) Filed: Jan. 24, 2006

(65) Prior Publication Data
US 2006/0163697 A1    Jul. 27, 2006

(30) Foreign Application Priority Data
Jan. 24, 2005    (KR)    ............. 10-2005-0006370

(51) Int. Cl.
*H01L 29/732* (2006.01)

(52) U.S. Cl. ............. 257/587; 257/588; 257/E29.185

(58) Field of Classification Search ........... 257/E29.185
See application file for complete search history.

(56) References Cited

U.S. PATENT DOCUMENTS

| 5,024,971 | A | 6/1991 | Baker et al. |
| 2001/0017399 | A1 | 8/2001 | Oda et al. |
| 2004/0094823 | A1* | 5/2004 | Matsuno ............. 257/565 |
| 2004/0251515 | A1* | 12/2004 | Yang et al. ............. 257/552 |
| 2005/0001238 | A1* | 1/2005 | Oue et al. ............. 257/197 |

FOREIGN PATENT DOCUMENTS

| JP | 2003-303828 | 10/2003 |
| KR | 1020030027313 | 4/2003 |
| KR | 1020030045941 | 6/2003 |

* cited by examiner

*Primary Examiner*—Stephen W Smoot
(74) *Attorney, Agent, or Firm*—Volentine & Whitt, PLLC

(57) ABSTRACT

Disclosed are a bipolar transistor comprising an emitter terminal and a base terminal having substantially equal heights, and a method of fabricating the same. The bipolar transistor comprises a silicon-germanium layer acting as a base and formed on a semiconductor layer acting as a collector. The bipolar transistor further comprises an insulating layer having contact windows for an emitter terminal and a collector terminal. The emitter and collector terminals are formed by forming a polysilicon layer filling the contact windows and performing a planarization process on the polysilicon layer. An ion implantation process is performed to form a polysilicon emitter terminal and a polysilicon base terminal.

17 Claims, 21 Drawing Sheets

BIPOLAR TRANSISTOR HAVING SEMICONDUCTOR PATTERNS FILLING CONTACT WINDOWS OF AN INSULATING LAYER

BACKGROUND OF THE INVENTION

1. Field of the Invention

Embodiments of the invention relate to a semiconductor device and a related method of fabrication. More particularly, embodiments of the invention relate to a bipolar transistor and a related method of fabrication.

2. Description of Related Art

Using a complementary metal-oxide semiconductor (CMOS) fabrication technology, an n-channel MOS field effect transistor (MOSFET) and a p-channel MOSFET may be formed adjacent to each other on a semiconductor substrate. The steady development of the CMOS fabrication technology over the past several decades has resulted in a present ability to fabricate highly integrated, high performance semiconductor devices at low cost. CMOS devices are widely used to fabricate radio frequency (RF) circuits, RF system-on-chips (SoC), and many other devices.

Although the CMOS devices have very solid operating characteristics, they often do not satisfy the low noise requirements demanded by contemporary RF circuits and/or circuit elements. Low noise amplifiers (LNAs) and a voltage controlled oscillators (VCOs) are ready examples of RF circuits demanding low noise performance.

As compared with MOSFETs, bipolar transistors have low noise, wide linear gain, good frequency response, and high current drivability. In order to implement certain circuits or circuit functions, bipolar transistors are often formed on the same semiconductor substrate as CMOS devices. Indeed, in one common application, high-performance bipolar transistors are used to implement RF circuits and CMOS devices are used to implement associated logic circuits.

To enhance the operating speed of bipolar transistors, the base region needs to be narrowly formed so that carriers may move quickly from emitter to collector. Alternatively, the base region may be doped with a high concentration of conductive impurities in order to reduce the resistance of the base region. Generally, a very narrow base region is formed using an ion implantation process. However, it is very difficult to form an exceptionally narrow base region using conventional ion implantation processes.

Accordingly, the base regions of bipolar transistors are sometimes formed using methods that include an epitaxial technique. According to such epitaxial base formation techniques, a thin base region having a high doping concentration may be formed because dopant ions are added during the epitaxial growth process.

To increase the doping concentration of the base region for purposes of enhancing the operating speed, it is also necessary to increase the doping concentration of the corresponding emitter region in order to obtain high current gain. However, increasing the doping concentration of the emitter region causes a reduction in bandgap, resulting in decreased carrier injection efficiency and reduced emitter-base breakdown voltage. These trade-offs practically restrict the use of the foregoing techniques in attempts to improve the operating speed of bipolar transistors.

As a result, methods of forming a heterojunction between base and emitter have been proposed. Within such heterojunction structures the bandgap of the emitter is different from that of the base. To form the heterojunction, the base region is typically formed from silicon-germanium, which has a narrower bandgap than that of silicon. In the heterojunction structure, the emitter may emit carriers to the base with greater efficiency.

Figure (FIG.) 1 is a schematic sectional view of a heterojunction bipolar transistor disclosed, for example, in U.S. Pat. No. 6,251,738. In FIG. 1, reference numerals 10 and 18 indicate a silicon substrate and a collector, respectively. A p-type epitaxial silicon-germanium (Si—Ge) base 22 is grown on substrate 10. A p-type polysilicon base 36 is formed on Si—Ge base 22. Reference numerals 42 and 54 indicate spacers and a base contact, respectively. A reference numeral 44 indicates an n-type polysilicon emitter. Reference numerals 56 and 52 indicate an emitter contact and a collector contact, respectively. Within the foregoing conventional structure, polysilicon emitter 44 and polysilicon base 36 are electrically isolated from each other by spacers 42.

In addition, the top surface of polysilicon emitter 44 is relatively higher than that of the polysilicon base 36, thereby forming a large step between polysilicon emitter 44 and collector 18. Accordingly, the polysilicon emitter 44 whose top surface is relatively high may be over-etched when an insulating interlayer 50 is etched to form contact holes for emitter contact 56, base contact 54, and collector contact 52. Specifically, when a silicide layer is used to form a low resistance contact, the over-etching problem becomes even more serious. The silicide layer is formed relatively thinly on n-type polysilicon emitter 44 compared with p-type polysilicon base 36. Accordingly, the silicide layer formed on these elements may be particularly susceptible to over-etching. Consequently, a stable contact having low resistance is very difficult to form.

Furthermore, in the foregoing conventional structure, the process by which polysilicon base 36 and polysilicon emitter 44 are formed electrically isolated from each other is very complicated. That is, in order to form polysilicon base 36, epitaxial Si—Ge base region 22 is formed and then a polysilicon layer is deposited. Then, an etch-back process is used to expose epitaxial base region 22 through the polysilicon layer. A patterning process is then applied to the etched-back polysilicon base 36 to form a contact window 40 ultimately receiving polysilicon emitter 44. Then, spacers 42 are formed on sidewalls of contact window 40. Finally, another polysilicon layer is deposited and patterned to form polysilicon emitter 44.

FIG. 2 is a schematic sectional view of a bipolar transistor formed in accordance with a method such as the one disclosed, for example, in U.S. Pat. No. 6,744,080. In FIG. 2, reference numerals 2, 5, 9, 13 and 14 indicate a base, a base terminal, an emitter terminal, a base contact, and an emitter contact, respectively. Like the previous conventional example, emitter terminal 9 is relatively higher than base terminal 5, and the electrical isolation between emitter terminal 9 and base terminal 5 is achieved through a complicated fabrication process.

Accordingly, a bipolar transistor having enhanced operating speed but fabricated through a more simple process is required.

SUMMARY OF THE INVENTION

Embodiments of the present invention provide a method of fabricating a bipolar transistor having an improved structure and being less susceptible to the problems associated with conventional bipolar transistors, such as those discussed above. In one embodiment, the invention provides a planarization process adapted to form an emitter terminal and a base terminal having substantially similar heights. That is, the height of the conventionally formed emitter terminal is reduced in certain embodiments of the invention.

According to one embodiment of the invention, a semiconductor device comprises a first semiconductor layer having a first conductivity type, a second semiconductor layer having a second conductivity type and formed on the first semiconductor layer, and a first semiconductor pattern having the first conductivity type and a second semiconductor pattern having the second conductivity type, both formed apart from each other on the second semiconductor layer, wherein a height of the first semiconductor pattern is substantially equal to a height of the second semiconductor pattern.

According to another embodiment of the invention, a bipolar transistor comprises a first semiconductor layer having a first conductivity type and forming a collector, a second semiconductor layer having a second conductivity type and formed over the first semiconductor layer, the second semiconductor layer forming a base, an insulating layer formed on second semiconductor layer, the insulating layer having a first contact window and a second contact window exposing the second semiconductor layer, a first semiconductor pattern having the first conductivity type filling the first contact window and forming an emitter terminal, and a second semiconductor pattern having the second conductivity type filling the second contact window and forming a base terminal.

According to still another embodiment of the invention, a bipolar transistor comprises, a p-type silicon substrate, a heavily-doped n-type sub-collector region formed on the p-type silicon substrate, a slightly-doped n-type single-crystalline silicon layer formed on the sub-collector region, and a device isolation layer formed in the slightly-doped n-type single-crystalline silicon layer to define a base-emitter region and a collector contact region. The bi-polar transistor further comprises first and second low-resistance collector regions formed by implanting n-type dopant ions into the slightly-doped n-type silicon layer in the base-emitter region and the collector contact region, respectively, the first and second low-resistance collector regions being connected to the sub-collector region, a p-type silicon-germanium layer formed on the slightly-doped n-type single-crystalline silicon layer in the base-emitter region and serving as a base, and an insulating layer formed on the p-type silicon-germanium layer. The insulating layer comprises a first contact window disposed on the first low-resistance collector region and a second contact window spaced apart from the first contact window. The bi-polar transistor further comprises an n-type polysilicon pattern filling the first contact window and forming an emitter electrode, and a p-type polysilicon pattern filling the second contact window and forming a base terminal.

According to still another embodiment of the invention, a method of fabricating a bipolar transistor comprises forming a first semiconductor layer having a first conductivity type, forming a second semiconductor layer having a second conductivity type on the first semiconductor layer, forming an insulating layer on the second semiconductor layer, the insulating layer comprising first and second contact windows exposing the second semiconductor layer, forming a first polysilicon pattern having a first conductivity type and filling the first contact window, the first polysilicon pattern constituting at least part of an emitter terminal, and forming a second polysilicon pattern having a second conductivity type and filling the second contact window, the second polysilicon pattern constituting at least part of a base terminal.

According to still another embodiment of the present invention, a method of method of fabricating a bipolar transistor comprises preparing a substrate comprising a first semiconductor layer having a first conductivity type and constituting at least part of a collector, and forming a device isolation layer in the first semiconductor layer, forming a second semiconductor layer having a second conductivity type and constituting at least part of a base, forming an insulating layer having first and second contact windows exposing the second semiconductor layer, and forming a polysilicon layer on the insulating layer to fill the first and second contact windows. The method further comprises performing a planarization process on the insulating layer until the insulating layer is exposed, thereby forming a first polysilicon pattern filling the first contact window and a second polysilicon pattern filling the second contact window, implanting dopant ions of the first conductivity type into the first polysilicon pattern to form an emitter-base junction and an emitter terminal, and implanting dopant ions of the second conductivity type into the second polysilicon pattern to form a base terminal.

According to still another embodiment of the invention, a method of fabricating a bipolar transistor comprises forming a first semiconductor layer having a first conductivity type, the first semiconductor layer constituting at least part of a collector, forming a passivation layer on the first semiconductor layer, the passivation layer defining an emitter-base region, forming a second semiconductor layer having the second conductivity type, the second semiconductor layer constituting at least part of a base, and forming an insulating layer having a contact window exposing the emitter-base region. The method further comprises forming a polysilicon pattern of the first conductivity type filling the contact window and forming an emitter terminal, and patterning the insulating layer and the semiconductor region to define a base terminal.

BRIEF DESCRIPTION OF THE DRAWINGS

Several embodiments of the invention will be described with reference to the accompanying drawings. In the drawings, layer and region thicknesses may be exaggerated for clarity. In the drawings.

DESCRIPTION OF EXEMPLARY EMBODIMENTS

Reference will now be made in some additional detail to several embodiments of the invention. However, the invention is not limited to only the described embodiments. Rather the embodiments are presented as teaching examples, whereas the invention may by variously embodied.

Although the terms "first", "second", "third", etc. are used to describe various regions and layers, these regions and layers are not sequentially (e.g., an ordered list) limited by such terms. Rather, these terms are merely used to distinguish the regions or layers from other regions or layers. Accordingly, a specific "first layer" in one embodiment may be referred to as a "second layer" in another embodiment. It will also be understood that when a layer is referred to as being "on" another layer or substrate, it may be directly on the other layer or substrate, or intervening layers may also be present.

The illustrated embodiments of the invention are drawn in relation to a method of fabricating a bipolar transistor, specifically an npn bipolar transistor. It will be apparent to those of ordinary skill in the art that a pnp bipolar transistor might similarly be formed by reversing the polarity of the respective dopants. A bipolar transistor with two base contacts are exemplarily described below.

FIGS. 3 through 8 are schematic sectional views illustrating a method of fabricating a npn bipolar transistor according to one embodiment of the present invention.

Figure 1:
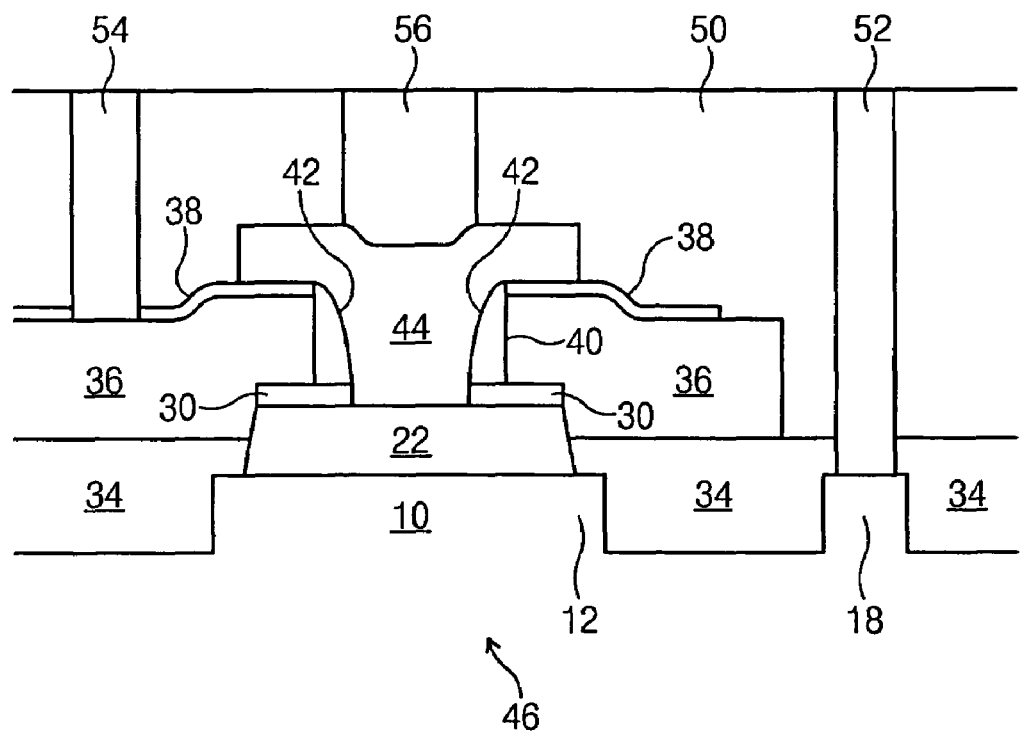
FIG. 1 is a schematic sectional view of a conventional bipolar transistor.
Figure 2:
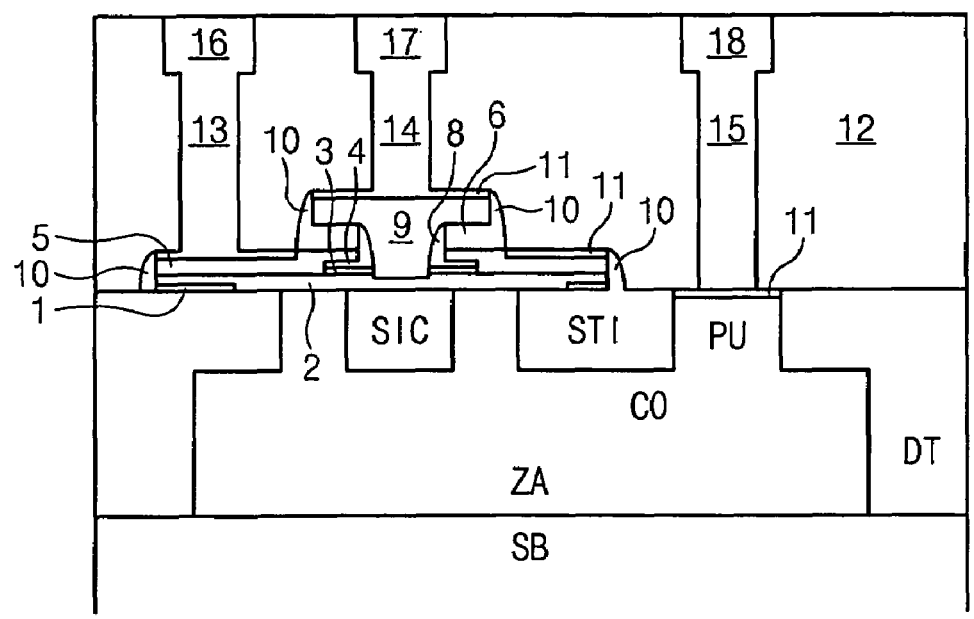
FIG. 2 is a schematic sectional view of another conventional bipolar transistor.
Figure 3:
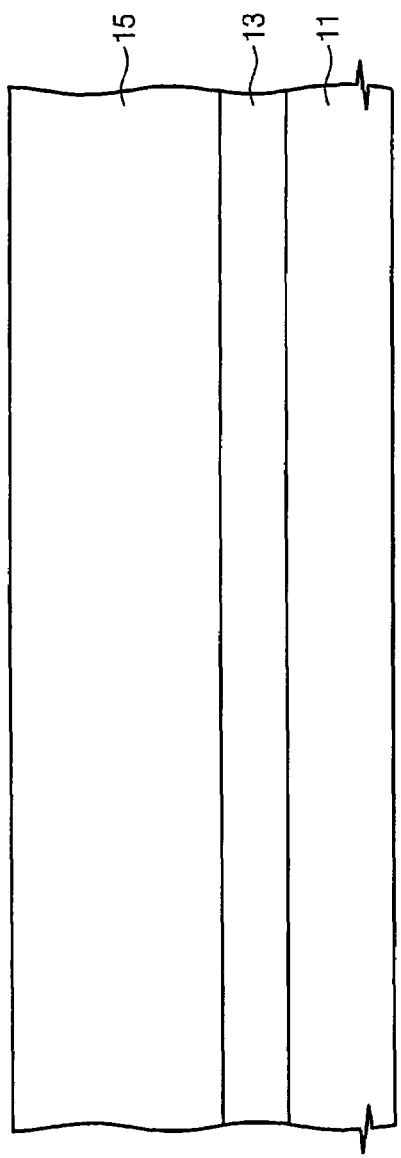
FIGS. 3 through 8 are schematic sectional views illustrating sequential procedures for fabricating an npn bipolar transistor according to one embodiment of the invention.

Referring to FIG. 3, a p-type silicon substrate 11 is prepared. P-type silicon substrate 11 can be formed by conventional techniques. Using an ion implantation process or a solid-state diffusion process, a first heavily-doped N$^+$ silicon layer (or sub-collector region) 13 heavily doped with n-type dopant such as arsenic (As) is formed on p-type silicon substrate 11. Then, using an epitaxial growth process, a lightly-doped N epitaxial single-crystalline silicon layer 15 is formed on first heavily-doped N$^+$ buried layer 13. Single-crystalline silicon layer 15 typically uses a phosphine (PH$_3$) gas as the dopant. Preferably, a cleaning process is performed on buried layer 13 before single-crystalline silicon layer 15 is formed.

Although not shown in FIG. 3, a p-type dopant such as boron can be ion-implanted at a low concentration in single-crystalline silicon layer 15 to form a guard ring providing electrical isolation from an adjacent collector due to a reverse-bias PN junction.

Figure 4:
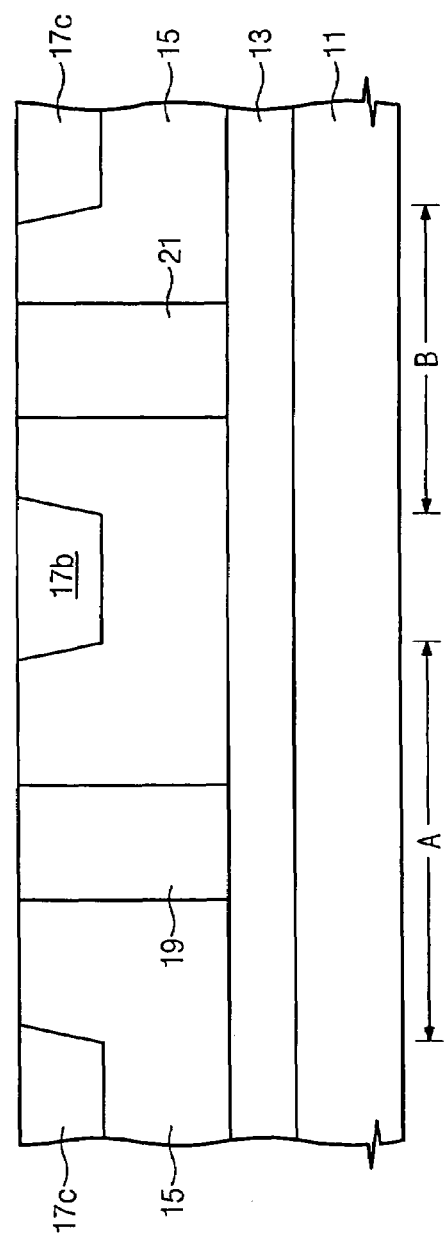

Referring to FIG. 4, a device isolation process such as shallow trench isolation (STI) is performed on silicon layer 15 to form device isolation layers 17b and 17c, which define a base-emitter region "A" and a collector contact region "B". Then, using an ion implantation process or a solid-state diffusion process, a second heavily-doped N$^+$ silicon layer 19 heavily doped with an n-type dopant, such as phosphorous, and a third N$^+$ silicon layer 21 (also referred to as a collector plug or collector sinker) are formed on lightly-doped N epitaxial silicon layer 15. Second heavily-doped N$^+$ silicon layer 19 is formed in base-emitter region "A". Third heavily-doped N$^+$ silicon layer 21 is formed in collector contact region "B" and serves as a collector contact. Second heavily-doped N$^+$ silicon layer 19 forms a low-resistance current path together with first and third heavily-doped N$^+$ silicon layers 13 and 21. Device isolation layers 17b and 17c can be formed before or after second and third heavily-doped N$^+$ silicon layers 19 and 21.

Figure 5:
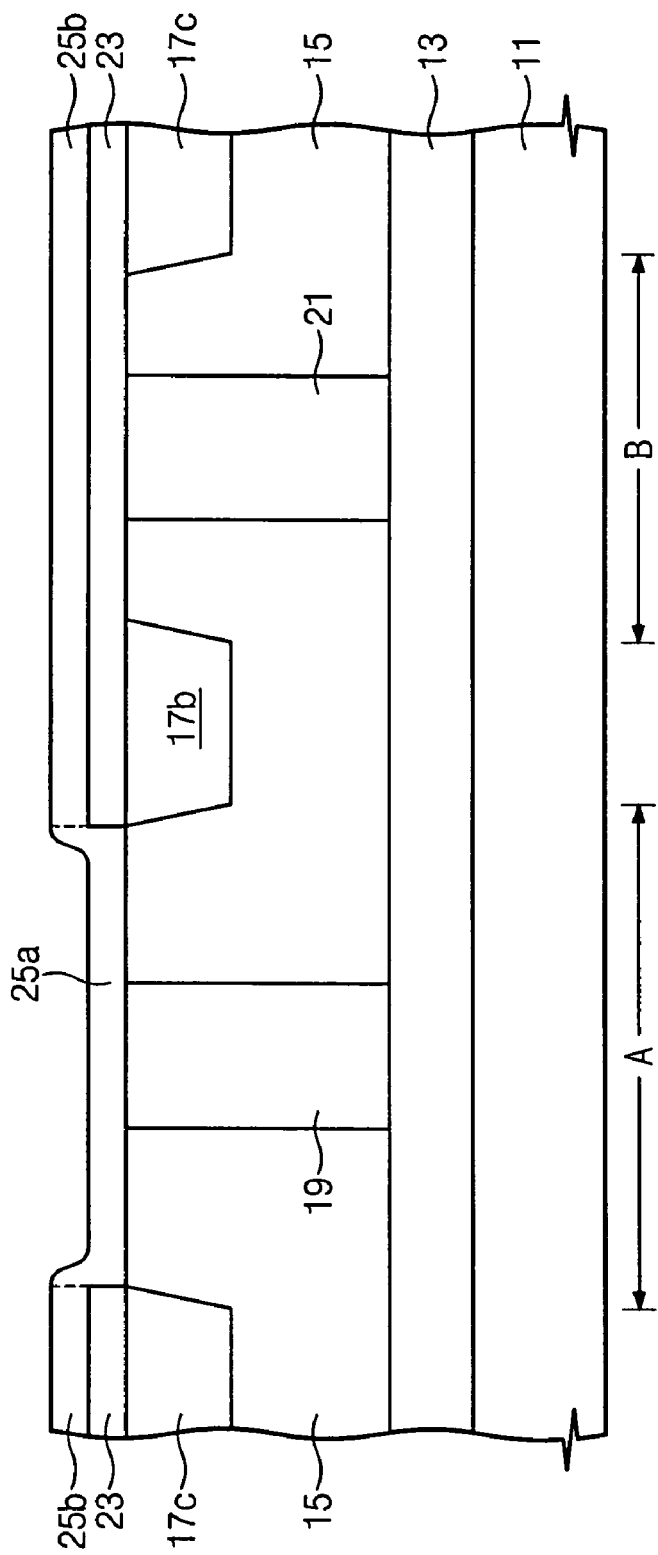

Referring to FIG. 5, a passivation layer 23 is formed over silicon layer 15 with a gap over base-emitter region "A". Passivation layer 23 may be formed, for example, of a silicon oxide layer through a chemical vapor deposition (CVD) process. A single-crystalline epitaxial silicon-germanium layer 25a doped with a p-type dopant such as boron is then formed on lightly-doped N epitaxial silicon layer 15 and second heavily-doped N$^+$ silicon layer 19, which are exposed through passivation layer 23. Single-crystalline epitaxial silicon-germanium layer 25a is typically formed by an epitaxial growth process or a CVD process. At the same time, a polycrystalline silicon-germanium layer 25b is deposited on passivation layer 23. P-type single-crystalline epitaxial silicon-germanium layer 25a forms a thin, p-type base. Accordingly, a heterojunction base having a desired doping concentration and a desired thickness can be formed by properly controlling an epitaxial growth process or a CVD process.

Figure 6:
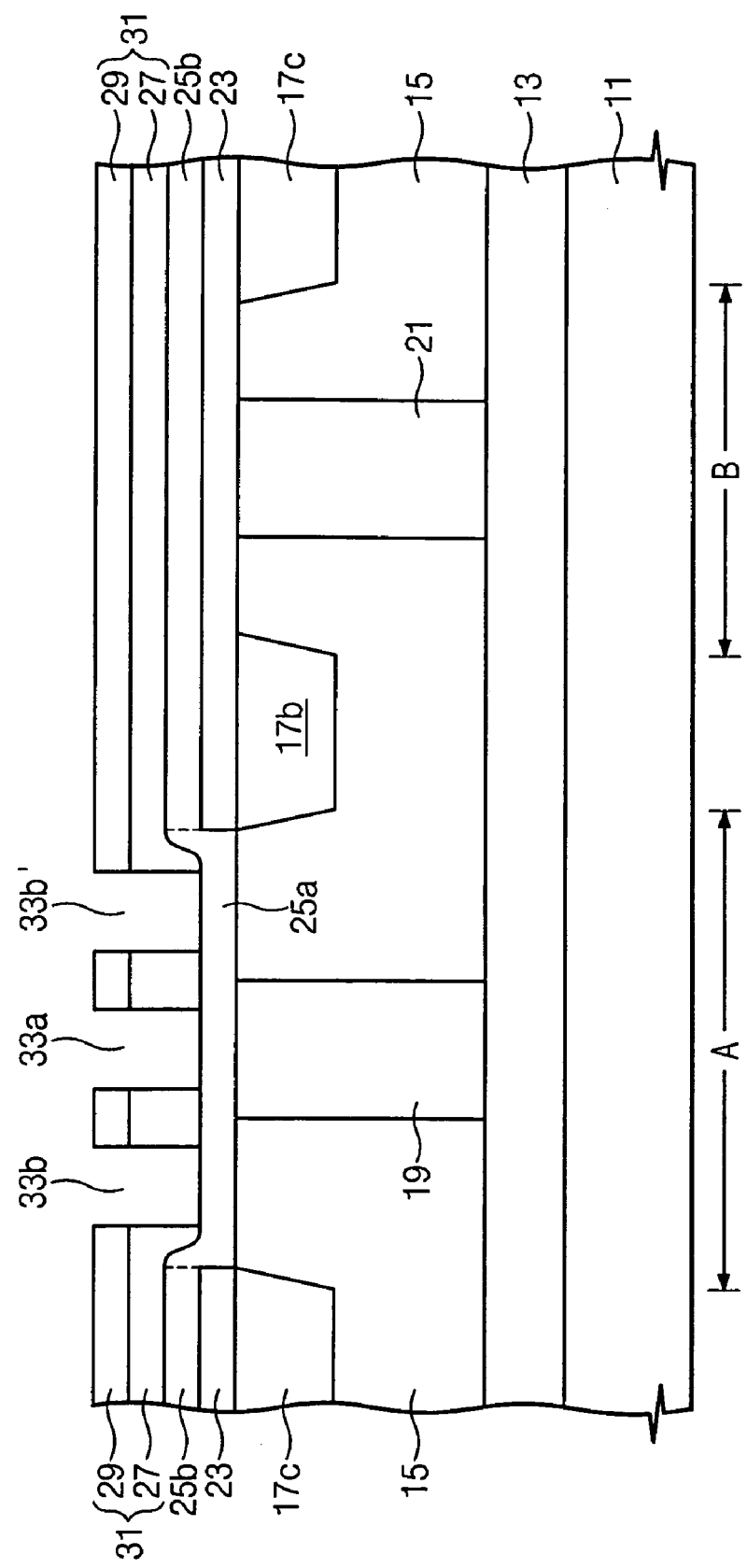

Referring to FIG. 6, an insulating layer 31 is formed on p-type single-crystalline silicon-germanium layer 25a and polycrystalline silicon-germanium layer 25b. Preferably, insulating layer 31 includes an oxide layer 27 and a nitride layer 29 stacked on oxide layer 27. Nitride layer 29, which is described later in further detail, serves as stop layer for a planarization process. Oxide layer 27 is typically formed of a silicon oxide layer through a CVD process. Nitride layer 29 is typically formed of a silicon nitride layer through a CVD process. The silicon nitride layer can have stoichiometrically various ranges of silicon and nitrogen atom contents. In addition, the silicon nitride layer can further include oxygen atoms.

Next, insulating layer 31 is patterned to form a first contact window 33a for an emitter terminal and second contact windows 33b and 33b' for a base terminal. First contact window 33a and second contact windows 33b and 33b' expose p-type single-crystalline silicon-germanium layer 25a. First contact window 33a is formed on second heavily-doped N$^+$ silicon layer 19 and second contact windows 33b and 33b' are formed on opposite sides of first contact window 33a.

In order to minimize the etching damage of p-type single-crystalline silicon-germanium layer 25a during the process of forming the contact windows, the contact windows are preferably formed by sequentially performing a dry etching process and a wet etching process. That is, most of insulating layer 31 is etched by the dry etching process, and then any remaining portion of thin insulating layer 31 is etched by the wet etching process.

Figure 7:
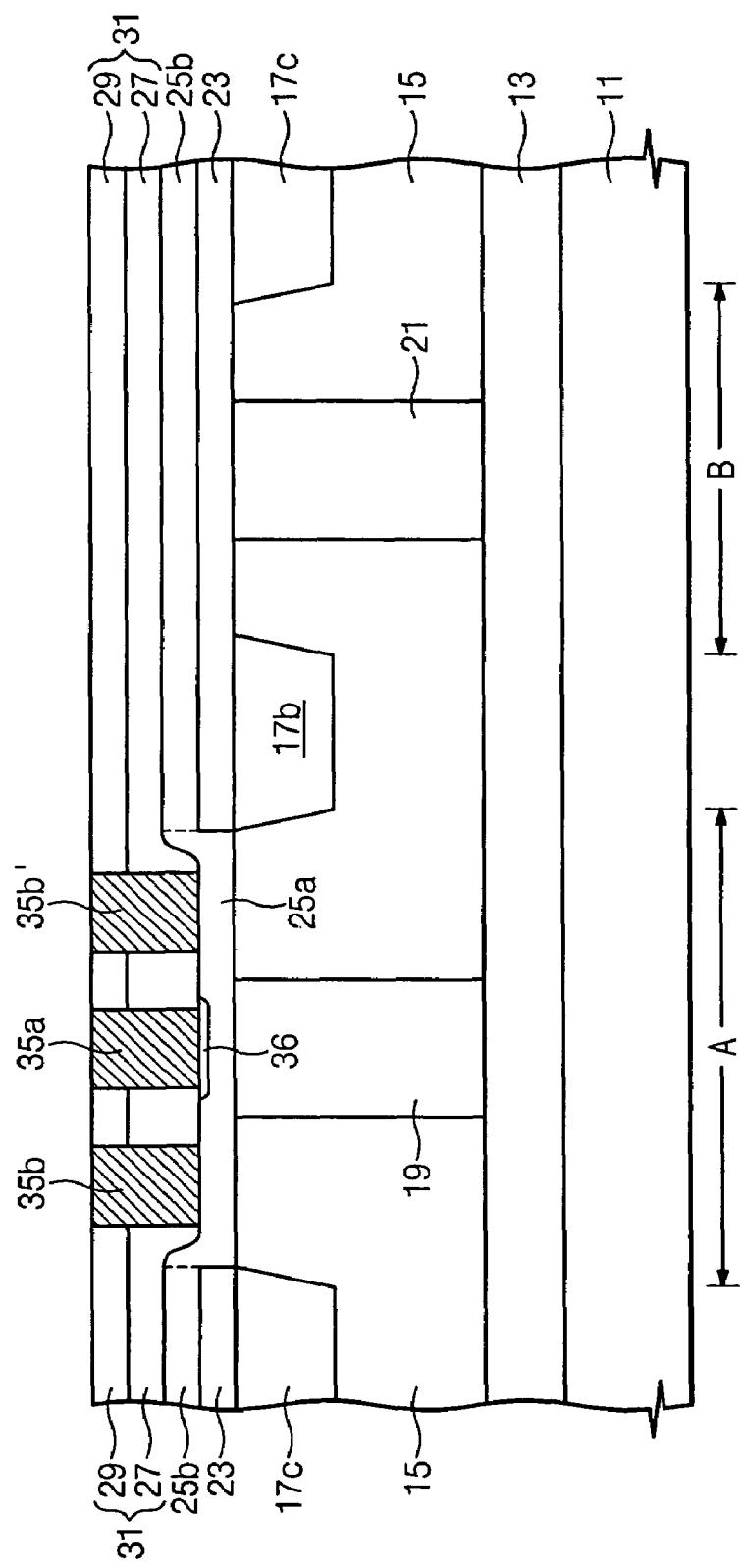

Referring to FIG. 7, a n-type polysilicon pattern 35a and p-type polysilicon patterns 35b and 35b' are formed to fill first contact window 33a and second contact windows 33b and 33b', respectively. P-type polysilicon patterns 35b and 35b' form the base terminal and n-type polysilicon pattern 35a forms the emitter terminal. In addition, n-type polysilicon pattern 35a forms a base-emitter junction 36 over p-type single-crystalline silicon-germanium layer 25a.

Polysilicon patterns 35a, 35b, and 35b' are formed by forming a polysilicon layer on insulating layer 31 to fill contact windows 33a, 33b and 33b' and then performing a planarization process to remove the polysilicon layer formed outside contact windows 33a, 33b and 33b'. The planarization process is performed until nitride layer 29 is exposed. The planarization process is typically performed using a chemical mechanical polishing (CMP) process or an etch-back process. The CMP process uses a slurry to polish a target layer chemically and mechanically. Then, n-type dopant ions such as phosphorous (P) are implanted on the polysilicon layer filling first contact window 33a. Consequently, n-type polysilicon pattern 35a filling first contact window 33a is formed and an emitter-base junction 36 is formed on silicon-germanium layer 25a by the implanted n-type dopant ions. A depth of emitter-base junction 36 can be properly adjusted by controlling the ion implantation process.

In a similar manner, p-type dopant ions such as boron (B) are implanted on the polysilicon layer filling second contact window 33b and 33b' to form p-type polysilicon patterns 35b and 35b'.

The ion implantation process used to form the base terminal and the emitter terminal can similarly be used to form source/drain regions in a CMOS device.

In general, the respective heights of n-type polysilicon pattern 35a and p-type polysilicon patterns 35b and 35b' depend on the height of insulating layer 31, and therefore their heights can be adjusted. In addition, because the base terminal and the emitter terminal are formed through the planarization process, their heights are substantially equal to each other.

Figure 8:
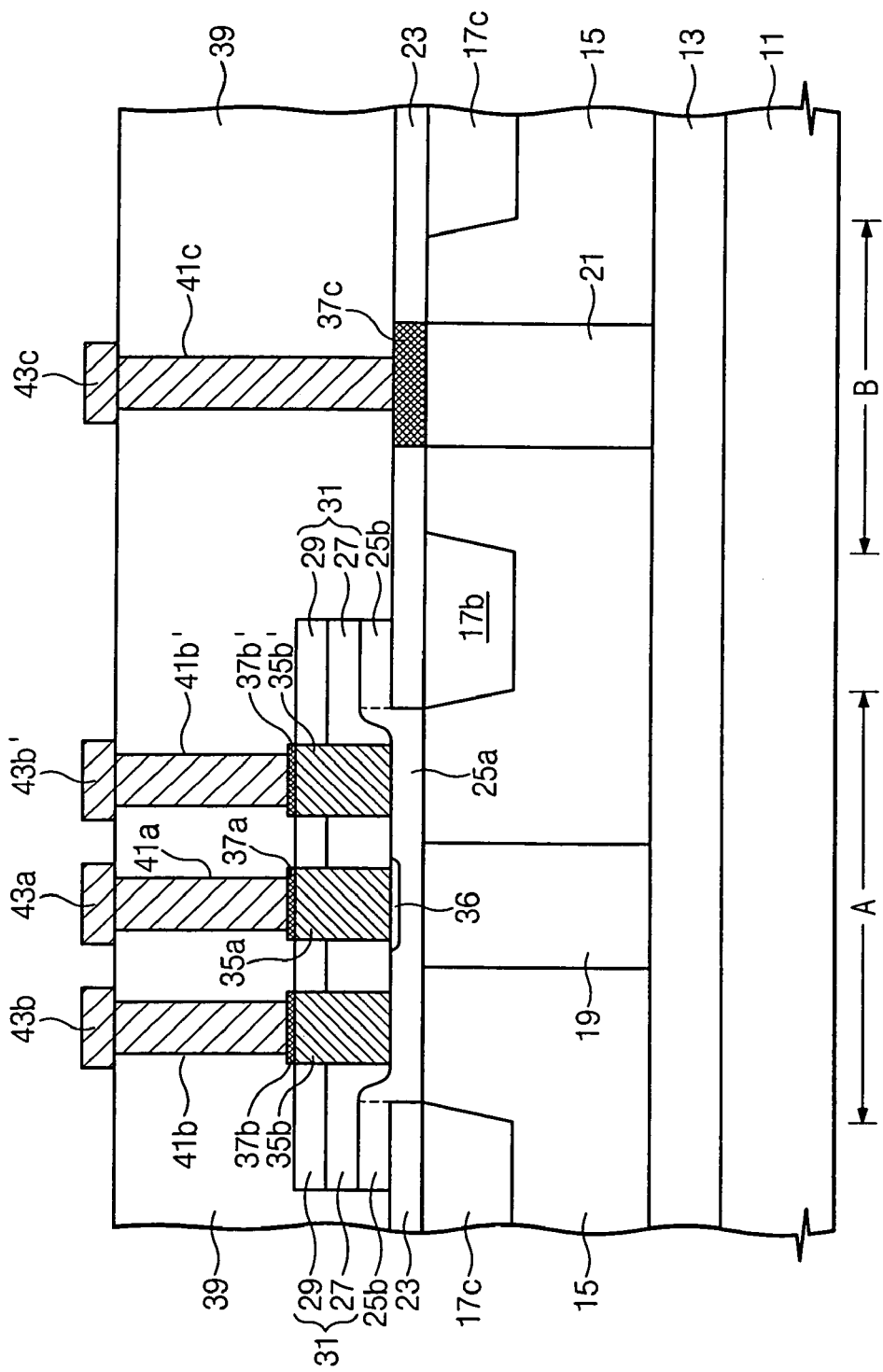

Referring to FIG. 8, a photolithography process is performed to remove insulating layer 31 and polycrystalline silicon-germanium layer 25b formed outside of base-emitter region "A" to provide electrical isolation between the base terminal and the collector terminal. Then, a portion of passivation layer 23 in collector contact region "B" is removed to expose third heavily-doped N+ silicon layer 21. A silicide passivation layer (not shown) may be formed so as to form a silicide layer at a specific region in which the CMOS device is to be formed. The silicide passivation layer and passivation layer 23 are patterned to expose n-type polysilicon pattern 35a, p-type polysilicon patterns 35b and 35b', and third heavily-doped N+ silicon layer 21. Then, although not shown in FIG. 8, a region of the silicide layer where the CMOS device is to be formed is exposed.

A silicide process is performed to form a silicide layer 37a on n-type polysilicon pattern 35a, silicide layers 37b and 37b' on p-type polysilicon patterns 35b and 35b', and a silicide layer 37c on the third heavily-doped N+ silicon layer 21, respectively. The silicide layers can be formed by conventional methods. For example, the silicon layers could be formed by depositing a metal, such as titanium, cobalt and nickel, and then performing a thermal treatment. Also, the silicide layers can be formed of a tungsten silicide layer.

Next, an insulating interlayer 39 is formed. Insulating interlayer 39 is typically formed of a silicon oxide layer using a conventional thin-film deposition technique such as a CVD process.

Insulating interlayer 39 is patterned to form contact holes 41a, 41b, 41b' and 41c exposing silicide layers 37a, 37b, 37b' and 37c. Then, a conductive layer is formed on the resulting structure and patterned to form a metal line 43a electrically contacting silicide layer 37a on polysilicon pattern 35a, metal lines 43b and 43b' electrically contacting silicide layers 37b and 37b' on polysilicon patterns 35b and 35b', and a metal line 43c electrically contacting silicide layer 37c on silicon layer 21.

Silicide layers 37b and 37b' are formed uniformly and thickly, while silicide layer 35a is formed relatively thinly. In contrast to conventional devices, the height of n-type polysilicon pattern 35a substantially equal to the heights of p-type polysilicon patterns 35b and 35b'. Accordingly, in the process of etching insulating interlayer 39 to form contact holes 41a, 41b, 41b' and 41c, silicide layer 37a is prevented from being over-etched.

N-type polysilicon pattern 35a and p-type polysilicon patterns 35b and 35b' are generally formed by an ion implantation process. For example, n-type dopant ions such as phosphorous (P) can be implanted in polysilicon patterns 35a, 35b, and 35b' when polysilicon is deposited to fill contact windows 33a, 33b and 33b'. In other words, the n-type doped polysilicon is deposited in-situ to fill contact windows 33a, 33b and 33b' and a planarization process is performed to form n-type polysilicon pattern 35a filling first contact window 33a and n-type polysilicon patterns filling second contact windows 33b and 33b'. Then, p-type dopant ions such as boron (B) are implanted into the n-type polysilicon patterns filling second contact windows 33b and 33b'. Thus, the conductivity-type of the polysilicon patterns changes from n-type to p-type to form p-type polysilicon patterns 35b and 35b'. Alternatively, p-type doped polysilicon could be deposited in-situ and a planarization process could be performed to form p-type polysilicon patterns 35b and 35b' filling second contact window 33b and 33b' and a p-type polysilicon pattern filling first contact window 33a. Then, n-type dopant ions could be implanted into the p-type polysilicon pattern filling first contact window 33a to change the conductivity-type of the polysilicon pattern from p-type to n-type to form n-type polysilicon pattern 35a.

After the polysilicon patterns filling contact windows 33a, 33b and 33b' are planarized, an etch-back process can be further performed on the polysilicon layer. Where the etch-back process is used, the heights of n-type polysilicon pattern 35a and p-type polysilicon patterns 35b and 35b' are further reduced. Accordingly, any distances between the base terminal and the emitter terminal and between the base terminal and the collector terminal may be reduced.

In addition, a third contact window exposing third heavily-doped N+ silicon layer 21 can be formed when or after first contact window 33a and second contact windows 33b and 33b' are formed. The third contact window is generally filled at the same time when first contact window 33a and second contact windows 33b and 33b' are filled with polysilicon. The ion-implantation process used to implant the n-type dopant in polycrystalline silicon-germanium layer 25b in collector contact region "B" is performed before forming insulating layer 31. Accordingly, the collector contact is formed to have a substantially equal height with an emitter contact and a base contact.

Figure 9:
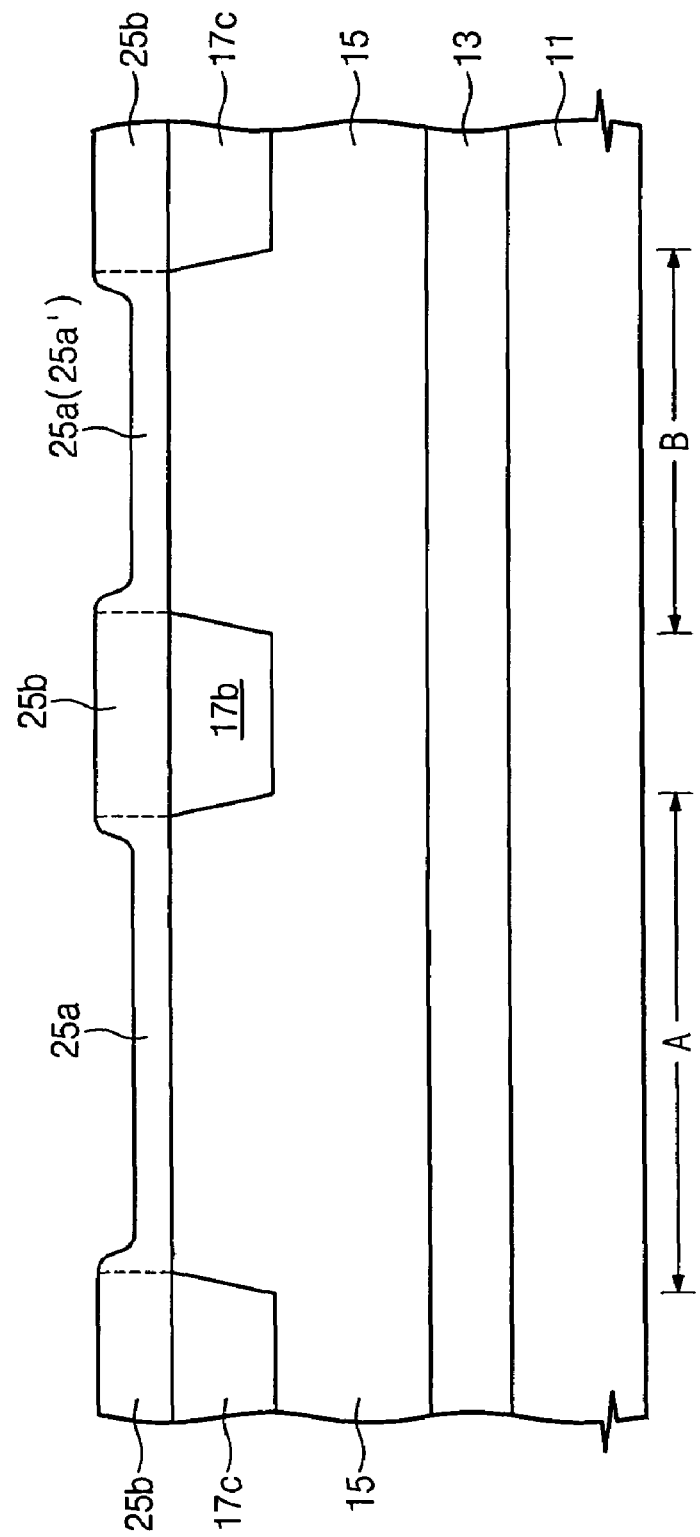
FIGS. 9 through 11 are schematic sectional views illustrating sequential procedures for fabricating an npn bipolar transistor according to another embodiment of the invention.
Figure 10:
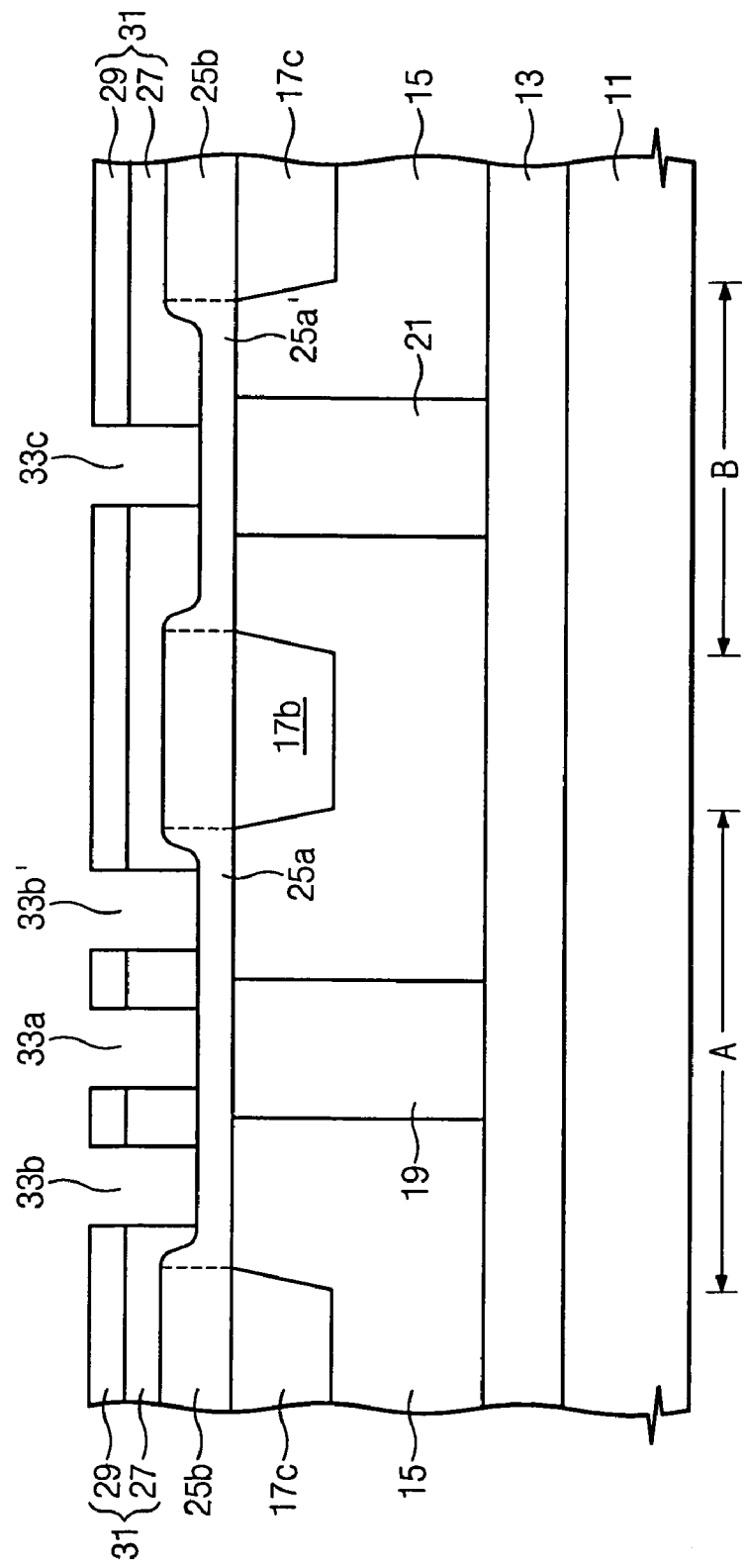
Figure 11:
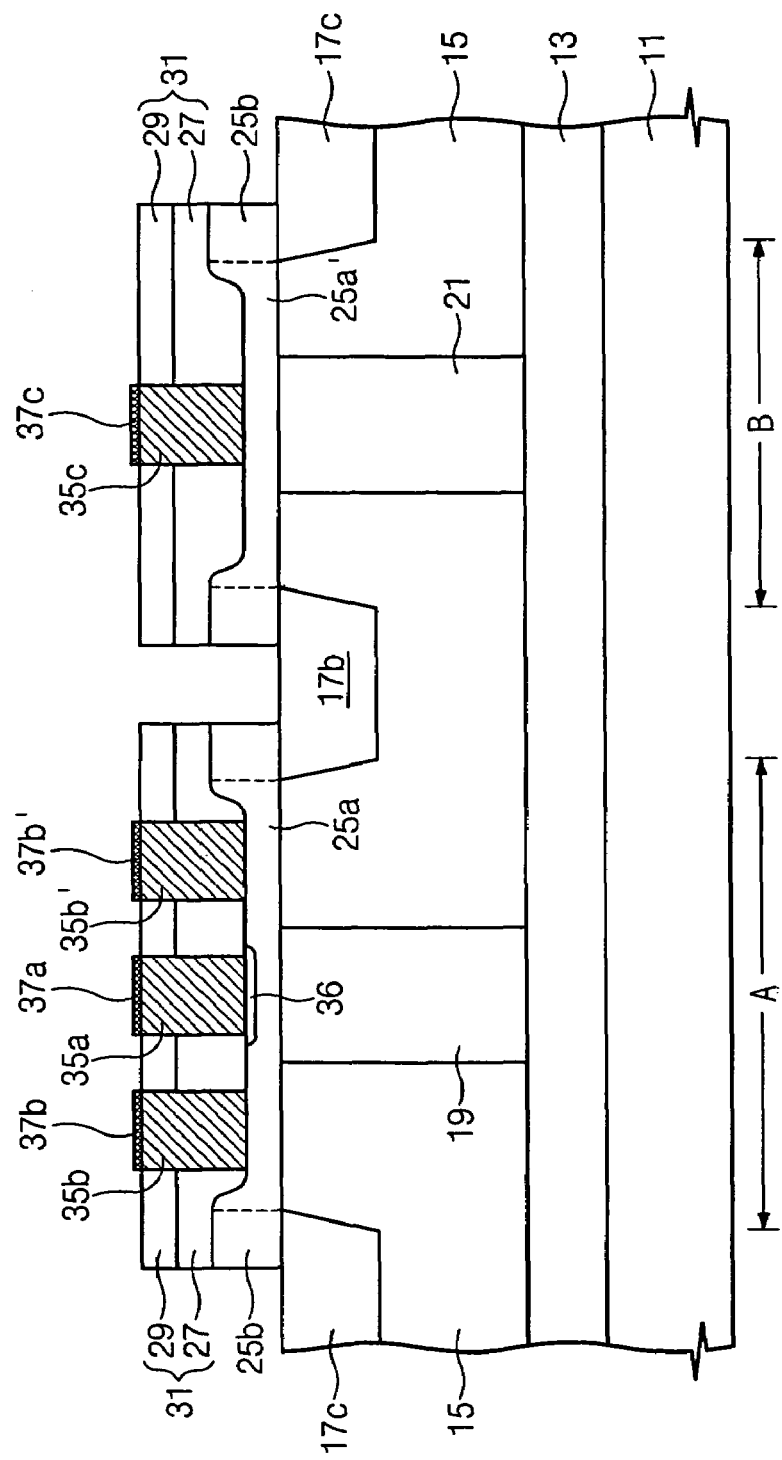

FIGS. 9 through 11 are schematic sectional views illustrating sequential procedures for fabricating an npn bipolar transistor according to another embodiment of the present invention. In the embodiment illustrated in FIGS. 9 through 11, passivation layer 23 is omitted.

Referring to FIG. 9, processes described in relation to FIGS. 3 and 4 are performed. Then, a p-type silicon-germanium layer 25a is formed using an epitaxial growth process or a CVD process. P-type single-crystalline epitaxial silicon-germanium layer 25a is formed in a base-emitter region "A" and a collector contact region "B". Meanwhile, polycrystalline silicon-germanium layers 25b can be formed on device isolation layers 17b and 17c. A counter doping process is performed such that the conductivity-type of epitaxial silicon-germanium layer 25a formed in the collector contact region "B" changes from p-type to n-type. That is, n-type dopant ions are implanted into p-type epitaxial silicon-germanium layer 25a in collector contact region "B" to form an n-type epitaxial silicon-germanium layer 25' in collector contact region "Be".

Referring to FIG. 10, an insulating layer 31 is formed and patterned to form a first contact window 33a for an emitter terminal, second contact windows 33b and 33b' for a base terminal, and a third contact window 33c for a collector terminal. First contact window 33a and second contact windows 33b and 33b' expose p-type epitaxial silicon-germanium layer 25a formed in base-emitter region "A". Third contact window 33c exposes p-type epitaxial silicon-germanium layer 25a' formed in collector contact region "B". First contact window 33a is formed on second heavily-doped N+ silicon layer 19 and second contact windows 33b and 33b' are formed on both sides of first contact window 33a. Third contact window 33c is formed on third heavily-doped N+ silicon layer 21.

Referring to FIG. 11, an n-type polysilicon pattern 35a is formed to fill first contact window 33a. An n-type polysilicon pattern 35c is formed to fill third contact window 33c. P-type polysilicon patterns 35b and 35b' are formed to fill second contact windows 33b and 33b'.

Specifically, the polysilicon layer is formed on insulating layer 31 to fill contact windows 33a, 33b, 33b' and 33c and a planarization process is performed to remove the polysilicon layer formed outside contact windows 33a, 33b, 33b' and 33c, so that the polysilicon layer remains only inside contact windows 33a, 33b, 33b' and 33c. The planarization process is generally performed on the polysilicon layer until a nitride layer 29 on an upper portion of insulating layer 31 is exposed. The planarization process may be performed using a CMP process or an etch-back process. The CMP process uses a slurry to polish a target layer chemically and mechanically. Then, n-type dopant ions are implanted into the polysilicon layers filling first and third contact windows 33a and 33c. Consequently, n-type polysilicon pattern 35a filling first contact window 33a is formed and an emitter-base junction 36 is formed on silicon-germanium layer 25a by the implanted n-type dopant ions. Also, the n-type polysilicon pattern 35c filling the third contact window 33c is formed. A depth of the emitter-base junction 36 can be properly adjusted by controlling the ion implantation process.

In the same manner, p-type dopant ions are implanted into the polysilicon layer filling second contact windows 33b and 33b' to form p-type polysilicon patterns 35b and 35b'.

Next, a photolithography process is performed to remove a portion of insulating layer 31 and polycrystalline silicon-germanium layer 27, thereby electrically isolating base-emitter region "A" from collector contact region "B". Specifically, insulating layer 31 on device isolation layers 17b and 17c is removed by a dry etching process, and then the exposed polycrystalline silicon-germanium layer 27 is removed by a dry or wet etching process until device isolation layers 17b and 17c are exposed.

A silicide process is performed to form a silicide layer 37a on emitter terminal 35a, silicide layers 37b and 37b' on base terminals 35b and 35b', and a silicide layer 37c on collector terminal 35c, respectively.

The patterning process performed on insulating layer 31 and polycrystalline silicon-germanium layer 27 can be performed after forming silicide layers 37a, 37b, and 37c.

Next, an insulating interlayer is formed and patterned to form contact holes exposing silicide layers 37a, 37b, 37b' and 37c. Then, a conductive material is deposited and patterned to form metal lines.

Accordingly, the respective heights of n-type polysilicon pattern 35a, n-type polysilicon pattern 35c, and p-type polysilicon patterns 35b and 35b' are dependent on the height of insulating layer 31, and they are formed by the planarization process. Accordingly, their heights are substantially equal to one another.

After the planarization process is performed on the polysilicon layer filling contact windows 33a, 33b, 33b' and 33c, an etch-back process can be further performed on the polysilicon layer. The etch-back process further reduces the respective heights of n-type polysilicon patterns 35a and 35c and p-type polysilicon patterns 35b and 35b', thereby reducing their resistances.

P-type polysilicon patterns 35b and 35b', n-type polysilicon pattern 35a, and the 35c can be formed in a single ion implantation process. For example, the n-type dopant ions are can be implanted at the same time when polysilicon is deposited to fill contact windows 33a, 33b, 33b' and 33c. In other words, the n-type doped polysilicon is deposited in-situ to fill contact windows 33a, 33b, 33b' and 33c and a planarization process is performed to form the n-type polysilicon pattern 35a filling first contact window 33a and the n-type polysilicon pattern 35c filling third contact window 33c. Then, the p-type dopant ions are implanted into the n-type polysilicon patterns filling second contact windows 33b and 33b'. Accordingly, the conductivity-type of the polysilicon patterns changes from n-type to p-type, thereby forming p-type polysilicon patterns 35b and 35b'. Alternatively, p-type doped polysilicon is deposited in-situ and a planarization process is performed to form p-type polysilicon patterns 35b and 35b' filling second contact windows 33b and 33b'. Then, n-type dopant ions are implanted into the p-type polysilicon pattern filling first contact window 33a and the p-type polysilicon pattern filling third contact window 33c. Thus, the conductivity-type of the polysilicon patterns changes from p-type to n-type, thereby forming n-type polysilicon patterns 35a and 35c.

FIGS. 12 through 15 are schematic sectional views illustrating a method of fabricating an npn bipolar transistor according to still another embodiment of the present invention. The method comprises performing the processes described with reference to FIGS. 3 and 4. Then, a passivation layer 23 exposing an emitter-base region is formed and a p-type epitaxial silicon-germanium layer is formed using an epitaxial growth process or a CVD process.

A single-crystalline silicon-germanium layer 25a is formed in a lightly-doped epitaxial silicon layer 15 of an emitter-base region "A" and a heavily-doped n-type silicon region 19, and a polycrystalline silicon-germanium layer 25b is formed on passivation layer 23. Polycrystalline silicon-germanium layer 25b is typically formed relatively thicker than single-crystalline silicon-germanium layer 25a. Accordingly, the thickness difference between passivation layer 23 and silicon-germanium layer 25a causes a step between a top surface of the polycrystalline silicon-germanium layer 25b and a top surface of the single-crystalline silicon-germanium layer 25a. The step defines a recessed region 28 and a sidewall 25s of single-crystalline silicon-germanium layer 25a. Single-crystalline silicon-germanium layer 25a forms a base, and polycrystalline silicon-germanium layer 25b forms a base terminal.

As passivation layer 23 becomes thicker, the step between the top surface of polycrystalline silicon-germanium layer 25b and the top surface of the single-crystalline silicon-germanium layer 25a increases.

Figure 12:
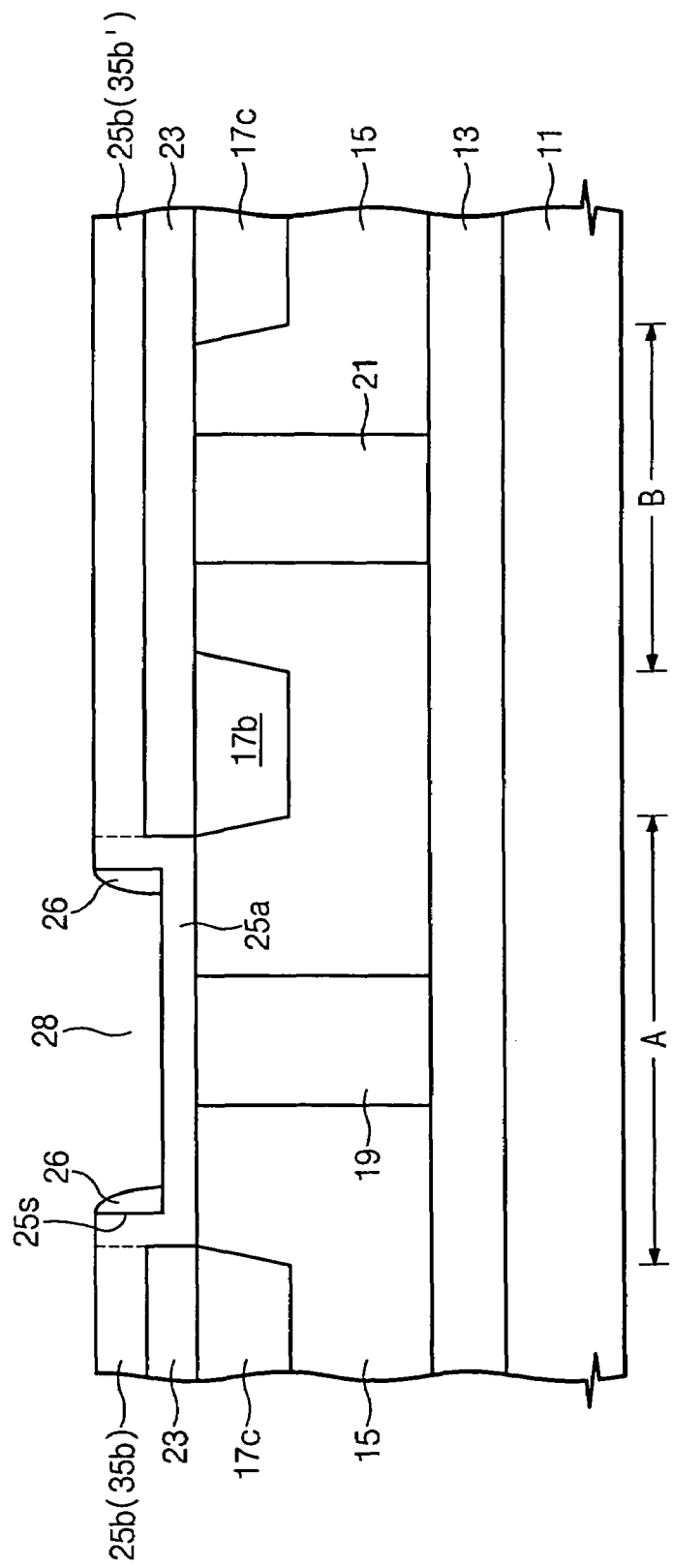
FIGS. 12 through 15 are schematic sectional views illustrating sequential procedures for fabricating an npn bipolar transistor according to yet another embodiment of the invention.

Referring to FIG. 12, an insulating material is deposited and etched back to form an insulating spacer 26 on sidewall 25s. Insulating spacer 26 functions to electrically isolate polycrystalline silicon-germanium layer 25b, which serves as the base terminal from the emitter terminal, which will be formed later. For example, insulating spacer 26 can be formed of a silicon nitride layer.

Figure 13:
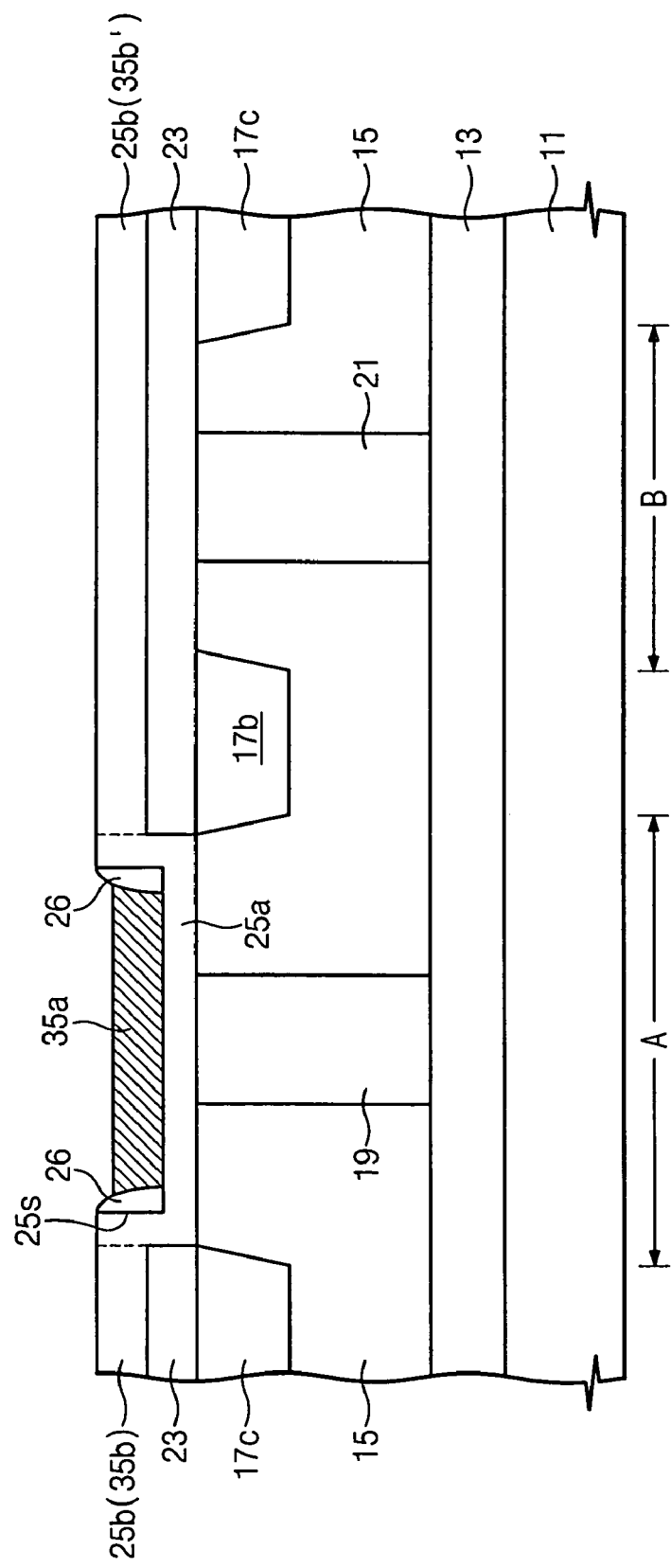

Referring to FIG. 13, a polysilicon layer is formed to fill recessed region 28, and a planarization process is performed until insulating spacer 26 is exposed, thereby restricting the polysilicon layer within recessed region 28. The planarization process can be performed as a CVD process or etch-back process. Following the planarization process, the height of polycrystalline silicon-germanium layer 25b formed outside recessed region 28 is substantially equal to that of the polysilicon layer within recessed region 28. In order to electrically isolate polycrystalline silicon-germanium layer 25b from the polysilicon layer, it is preferable that an over-etching is performed during the planarization process. That is, the planarization process is performed such that the heights of polycrystalline silicon-germanium layer 25b and the polysilicon layer are lower than the height of insulating spacer 26.

After the planarization process, the polysilicon layer can be further etched using a proper wet etching solution. Then, n-type dopant ions are implanted into recessed region 28 to form an n-type polysilicon pattern 35a within recessed region 28. N-type polysilicon pattern 35a restricted within the recessed region 28 serves as the emitter terminal.

Figure 14:
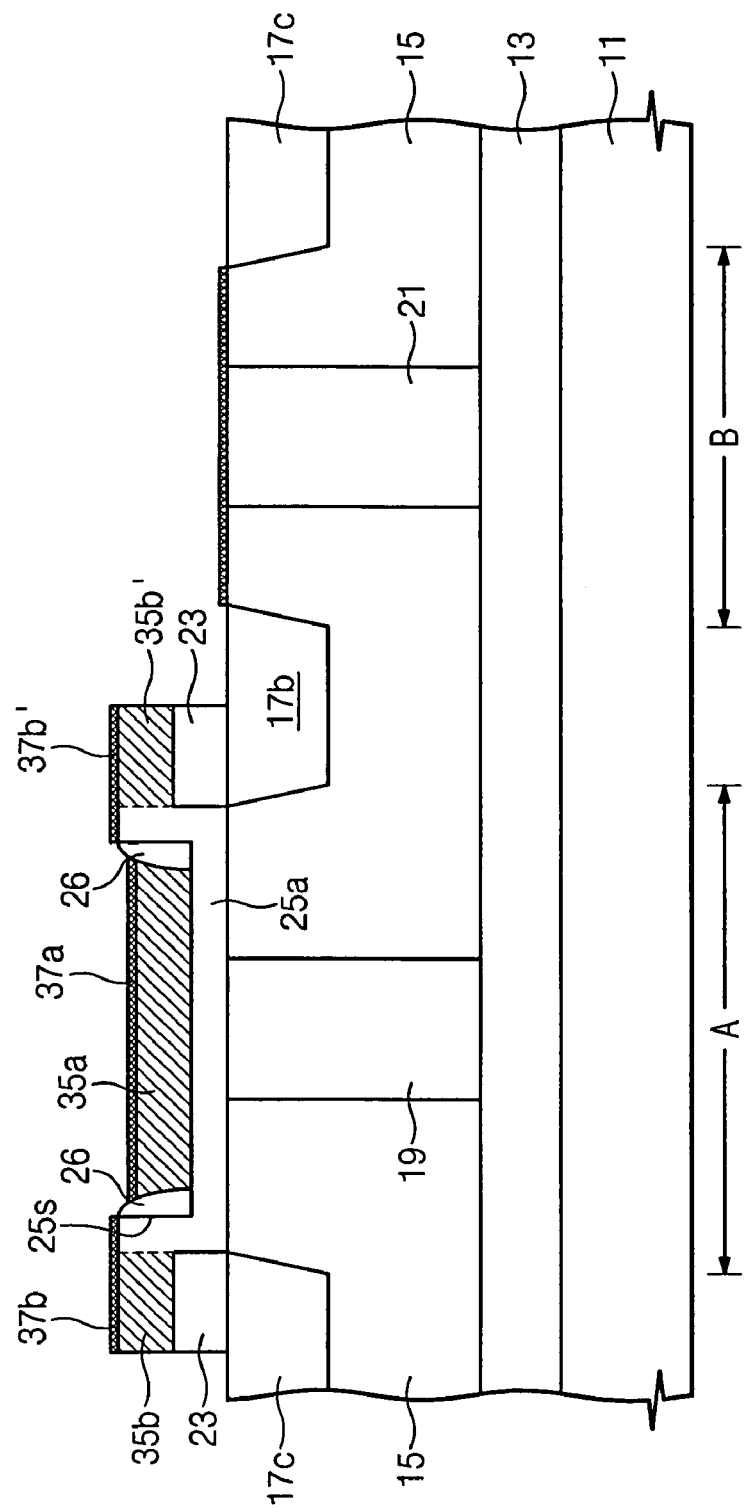

Referring to FIG. 14, a photolithography process is performed to pattern polycrystalline silicon-germanium layer 25b and a portion of passivation layer 23 formed therebelow. That is, polycrystalline silicon-germanium layer 25b and passivation layer 23 formed in collector contact region "B" are removed to form a polycrystalline silicon-germanium pattern 35b for the base terminal, and to expose a third heavily-doped n-type silicon layer 21 serving as the collector terminal.

A silicide process is performed to form a silicide layer 37a on n-type polysilicon pattern 35a serving as the emitter terminal, silicide layers 37b and 37b' on p-type polycrystalline silicon-germanium patterns 35b and 35b' serving as the base terminal, and a silicide layer 37c on third heavily-doped n-type silicon layer 21 serving as the collector terminal, respectively.

Figure 15:
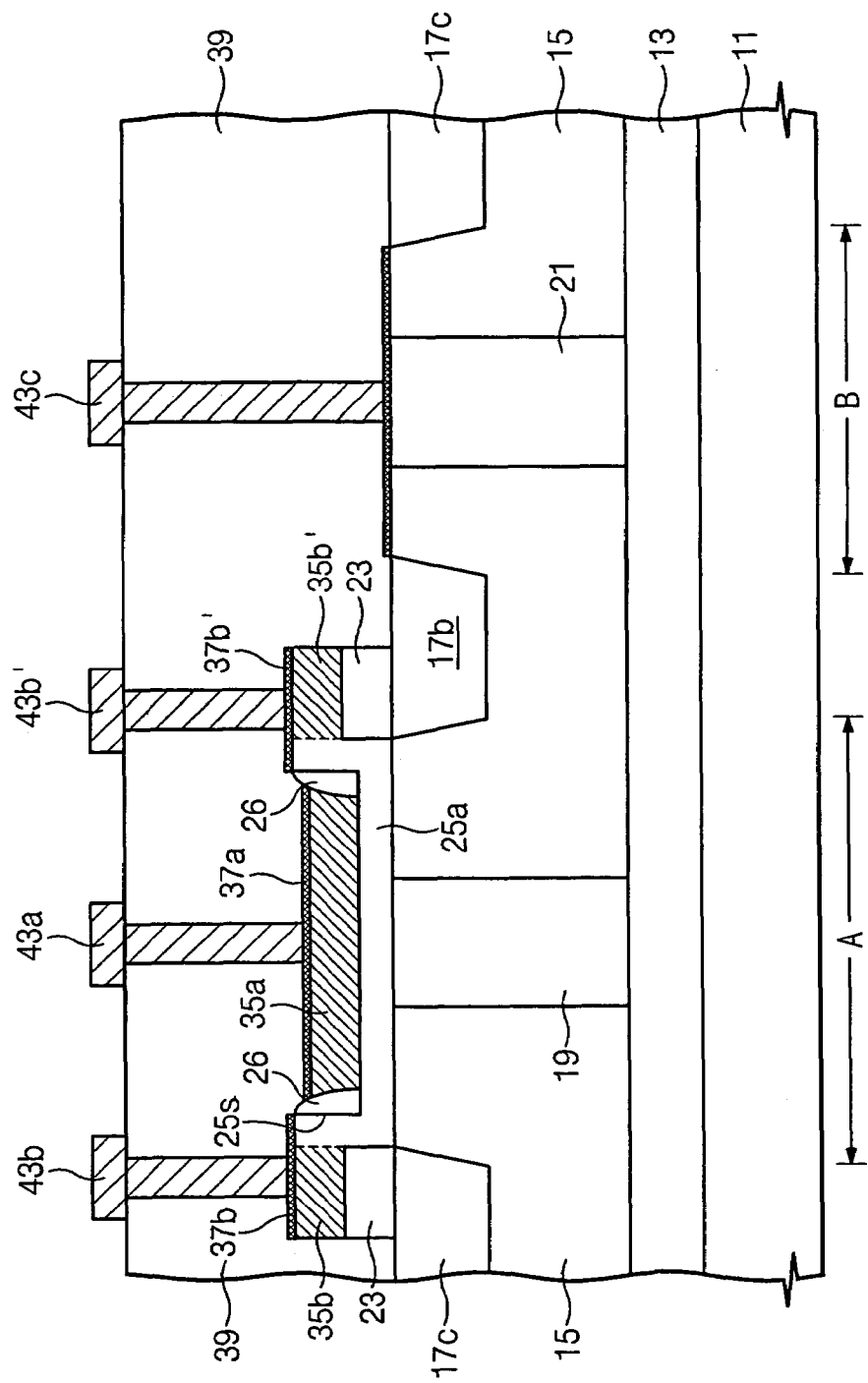

Referring to FIG. 15, various processes described in relation to FIG. 8 are performed to form metal lines 43a, 43b and 43c. That is, an insulating layer 39 is formed and patterned to form contact holes exposing silicide layers 37a, 37b, 37b, and 37c. Then, a conductive material is deposited and patterned.

The height of emitter terminal 35a is generally substantially equal to or lower than that of base terminals 35b and 35b'.

Figure 16:
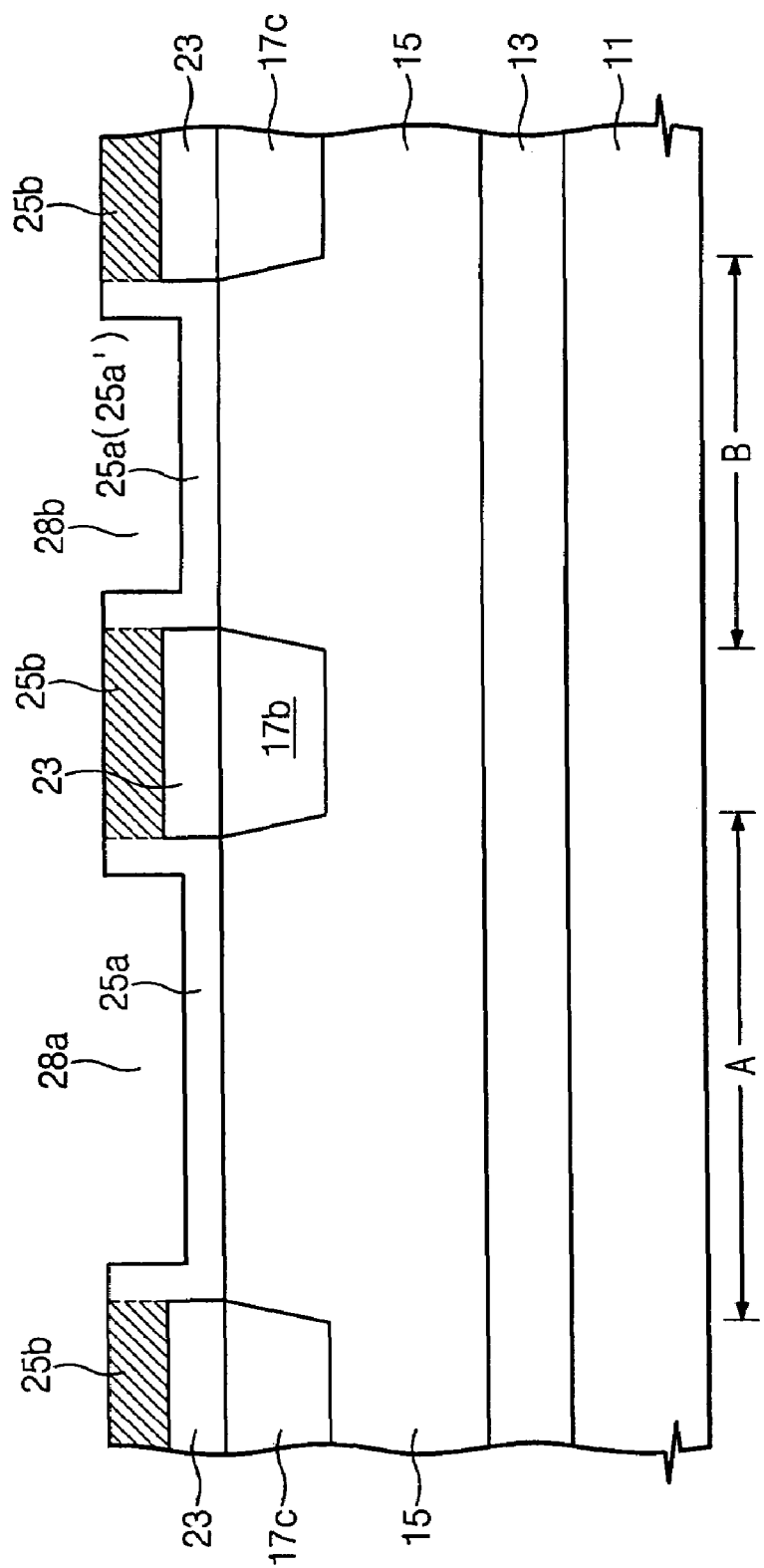
FIGS. 16 through 18 are schematic sectional views illustrating sequential procedures for fabricating an npn bipolar transistor according to still another embodiment of the invention.
Figure 17:
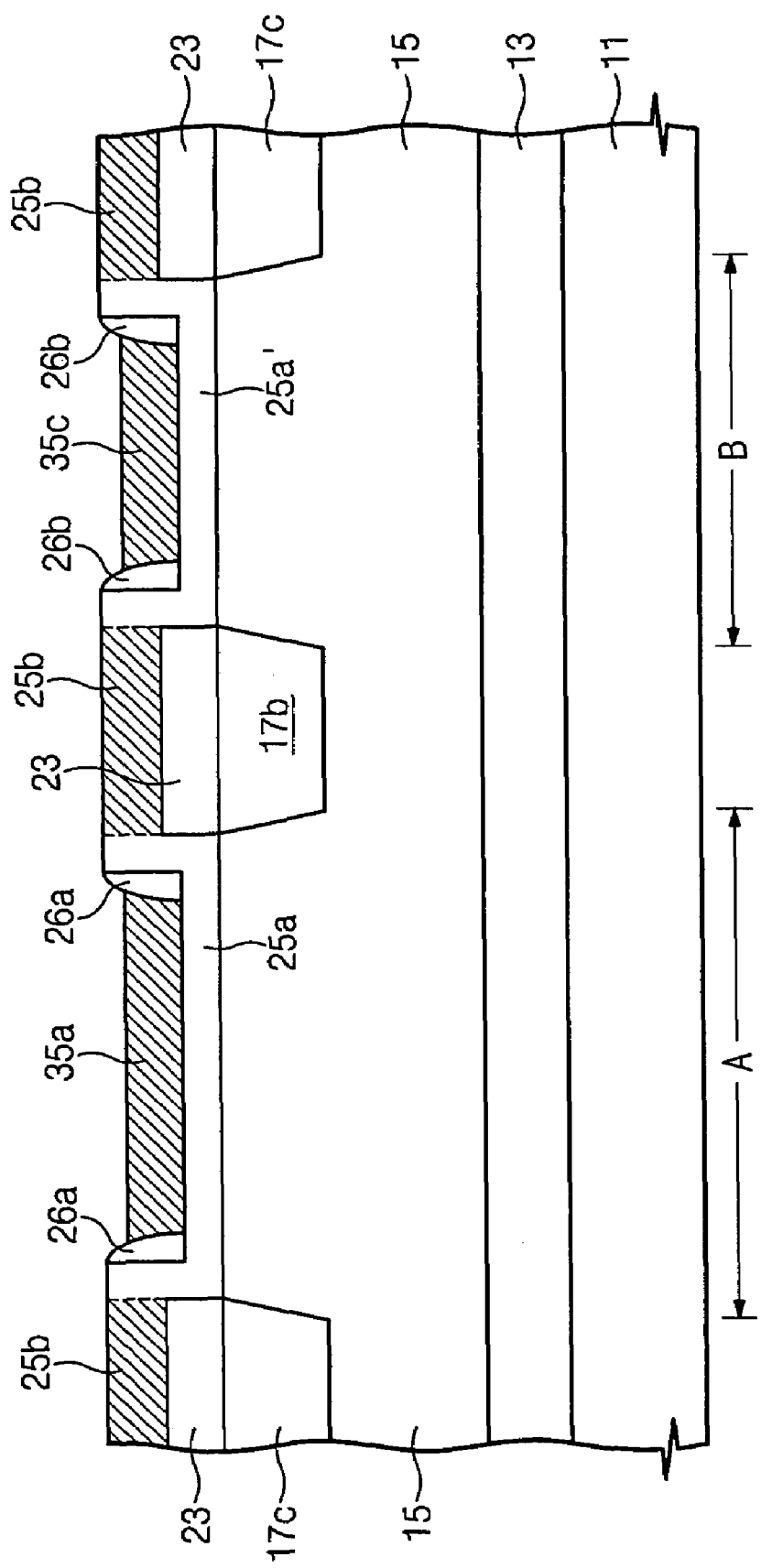
Figure 18:
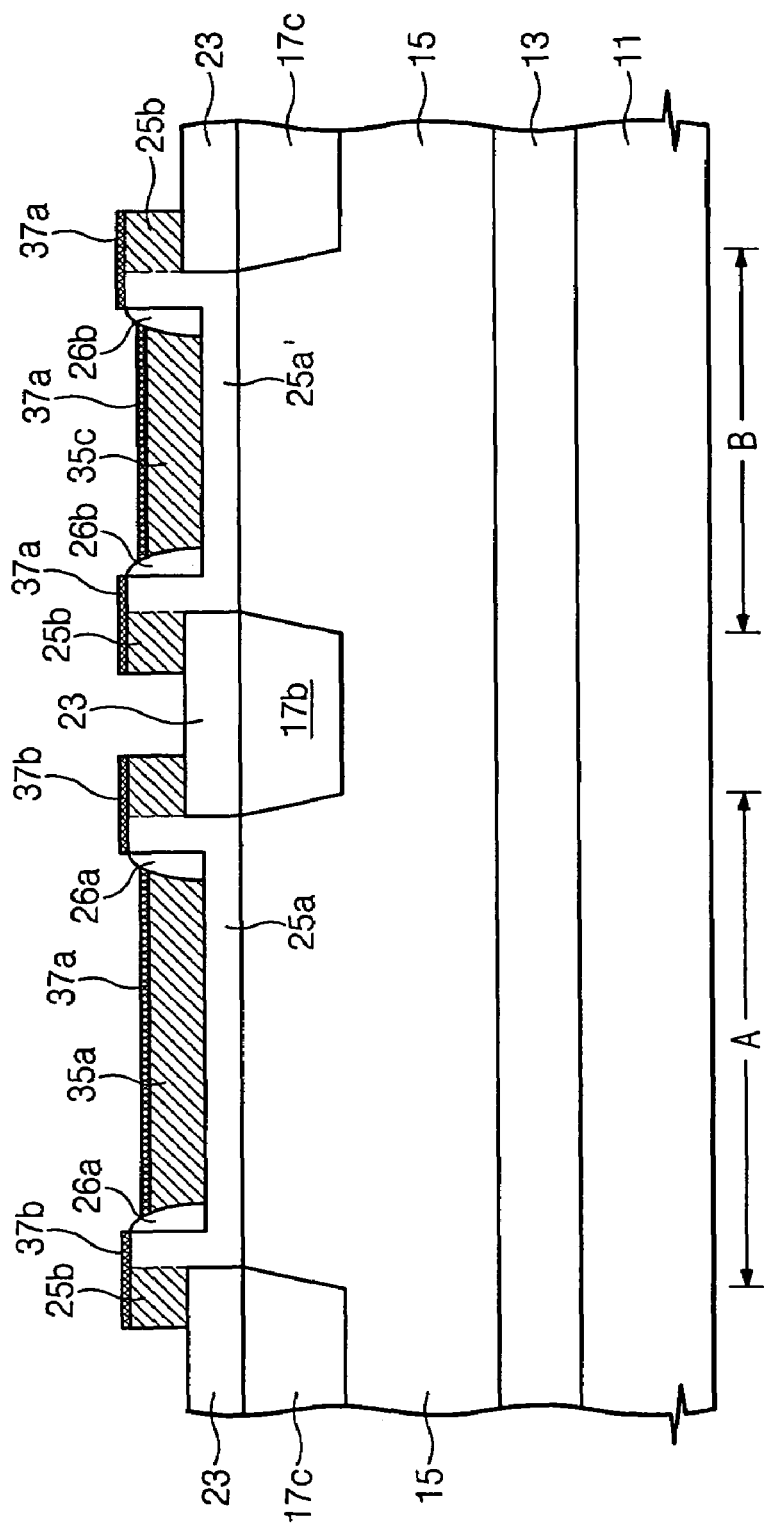

FIGS. 16 through 18 are schematic sectional views illustrating a method of fabricating an npn bipolar transistor according to still another embodiment of the present invention. In the embodiment illustrated in FIGS. 16 through 18, passivation layer 23 exposes collector contact region "B".

Referring to FIG. 16, the processes described with reference to FIGS. 3 and 4 are performed to form passivation layer 23. Passivation layer 23 exposes a base-emitter region "A" and a collector contact region "B". Using an epitaxial growth process or a CVD process, a p-type single-crystalline epitaxial silicon-germanium layer 25a is formed on the base-emitter region "A", a p-type single-crystalline epitaxial silicon-germanium layer 25a is formed on collector contact region "B", and a polycrystalline silicon-germanium layer 25b is formed on passivation layer 23. Silicon-germanium layer 25b formed on passivation layer 23 can be thicker than silicon-germanium layer 25a formed in base-emitter region "A" and the collector contact region "B". Due to the thickness difference of the silicon-germanium layers 25a and 25b and passivation layer 23, recessed regions 28a and 28b are defined in base-emitter region "A" and collector contact region "B". N-type dopant ions are implanted to change a conduction-type of the polycrystalline epitaxial silicon-germanium layer 25a from p-type to n-type.

Referring to FIG. 17, an insulating material is deposited and etched back to form an insulating spacer 26a on sidewalls of recessed region 28a in base-emitter region "A", and to form an insulating spacer 26b on sidewalls of recessed region 28b in collector contact region "B".

A polysilicon layer is formed to fill recessed regions 28a and 28b and a planarization process is performed to restrict the polysilicon layer within recessed regions 28a and 28b. The planarization process can be achieved using a CVD process or an etch-back process. Accordingly, polycrystalline silicon-germanium layer 25b formed outside recessed regions 28a and 28b, the polysilicon layer restricted within recessed regions 28a and 28b, and the polysilicon layer for the collector terminal have substantially equal thicknesses. After the planarization process, an etching process is preferably further performed to reduce the height of the polysilicon layer. Then, n-type dopant ions are implanted into recessed regions 28a and 28b to form an n-type polysilicon pattern 35a for the emitter terminal restricted within the recessed region 28a, and to form an n-type polysilicon pattern 35c for the collector terminal restricted in recessed region 28b.

Referring to FIG. 18, a photolithography process is performed to pattern polycrystalline silicon-germanium layer 25b and an insulating layer formed therebelow, thereby forming a polycrystalline silicon-germanium pattern 35b for the base terminal.

A silicide process is performed to form a silicide layer 37a on n-type polysilicon pattern 35a, which serves as an emitter contact, silicide layers 37b and 37b' on p-type polycrystalline silicon-germanium patterns 35b and 35b', which serve as a base contact, and a silicide layer 37c on n-type polysilicon pattern 35c, which serves as a collector contact.

Next, processes described with reference to FIG. 8 are performed to form metal lines. In particular, an insulating layer is formed and patterned to form contact holes exposing silicide layers 37a, 37b, 37b' and 37c. Then, a conductive material is deposited and patterned.

FIGS. 19 through 22 are schematic sectional views illustrating a method of fabricating an npn bipolar transistor according to yet another embodiment of the present invention. In the embodiment illustrated in FIGS. 19 through 22, an emitter terminal is formed through a planarization process and thus an emitter contact characteristic is improved.

Figure 19:
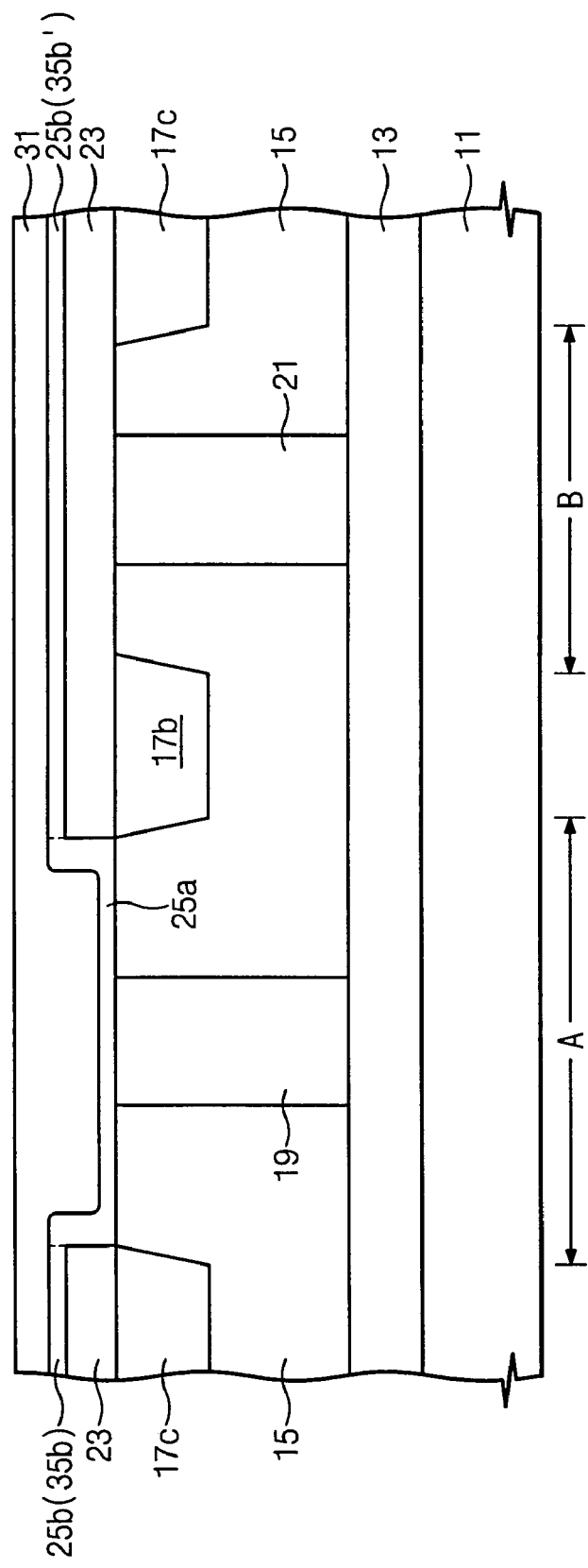
FIGS. 19 through 22 are schematic sectional views illustrating sequential procedures for fabricating an npn bipolar transistor according to a still another embodiment of the invention.

Referring to FIG. 19, processes described with reference to FIGS. 3 through 5 are performed to form passivation layer 23 and silicon-germanium layers 25a and 25b for a base. A single-crystalline silicon-germanium layer 23a formed in a base-emitter region "A", and a polycrystalline silicon-germanium layer 23b formed outside the emitter-base region. An insulating layer 31 is formed on the silicon-germanium layer. Insulating layer 31 includes an oxide layer and a nitride layer, which are-stacked in-sequence.

Figure 20:
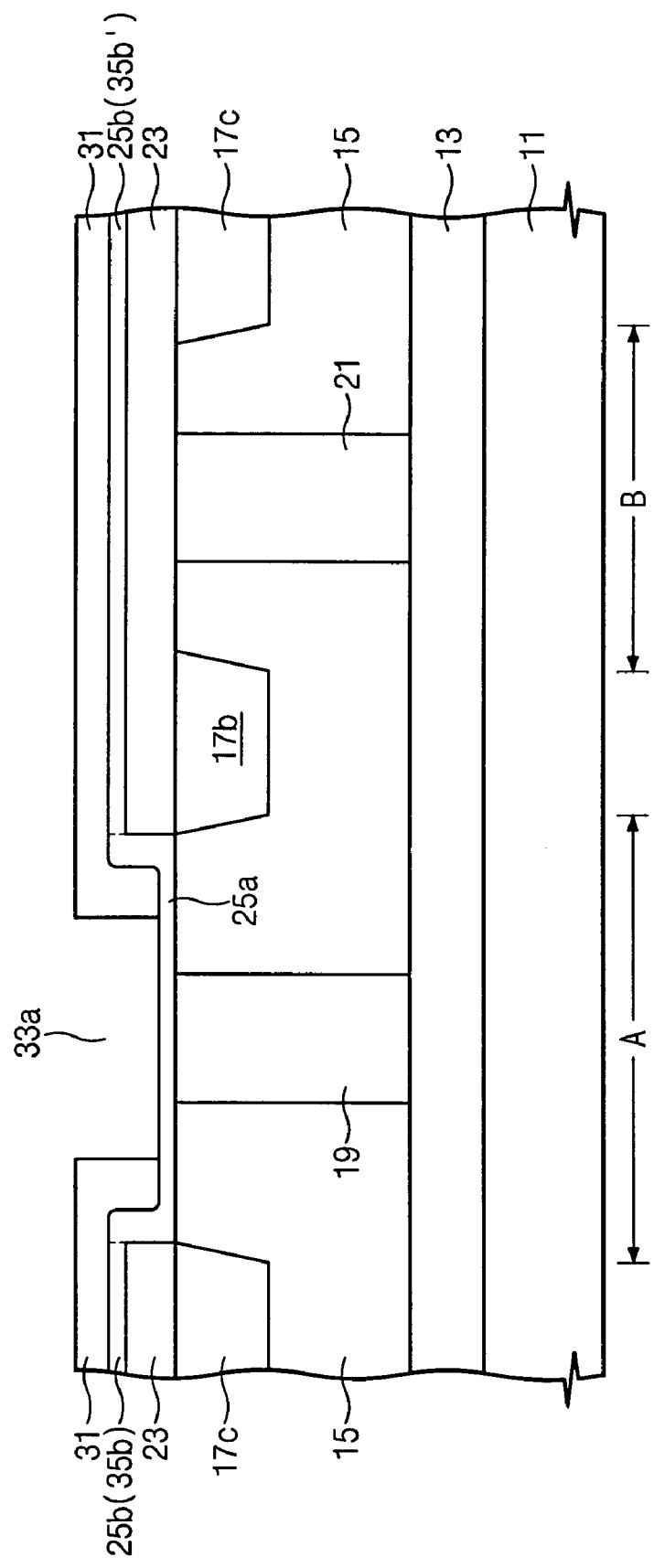

Referring to FIG. 20, a photolithography process is performed to pattern insulating layer 31, thereby forming a contact window 33a defining an emitter contact. Contact window 33a is formed on a second heavily-doped n-type silicon layer 19.

Figure 21:
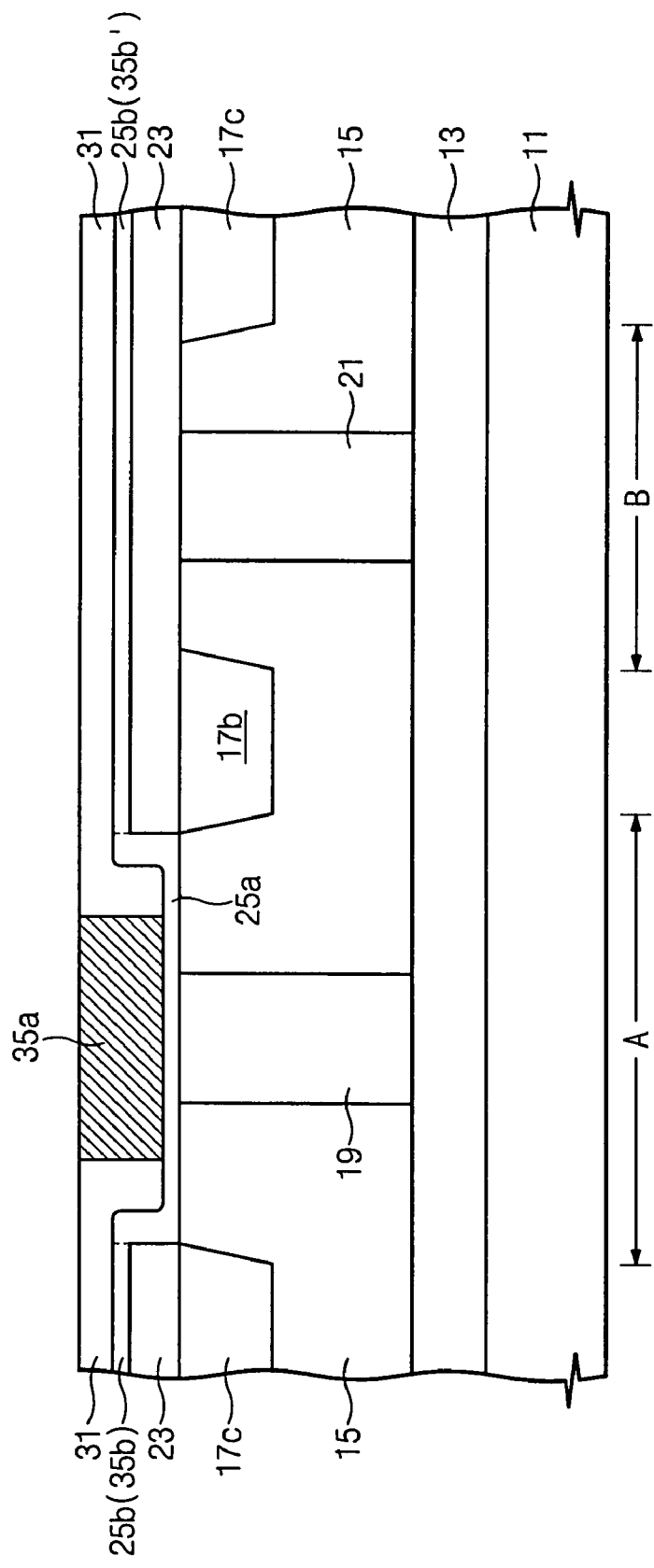

Referring to FIG. 21, n-type doped polysilicon is deposited and patterned to form an emitter terminal 35a within contact window 33a.

Figure 22:
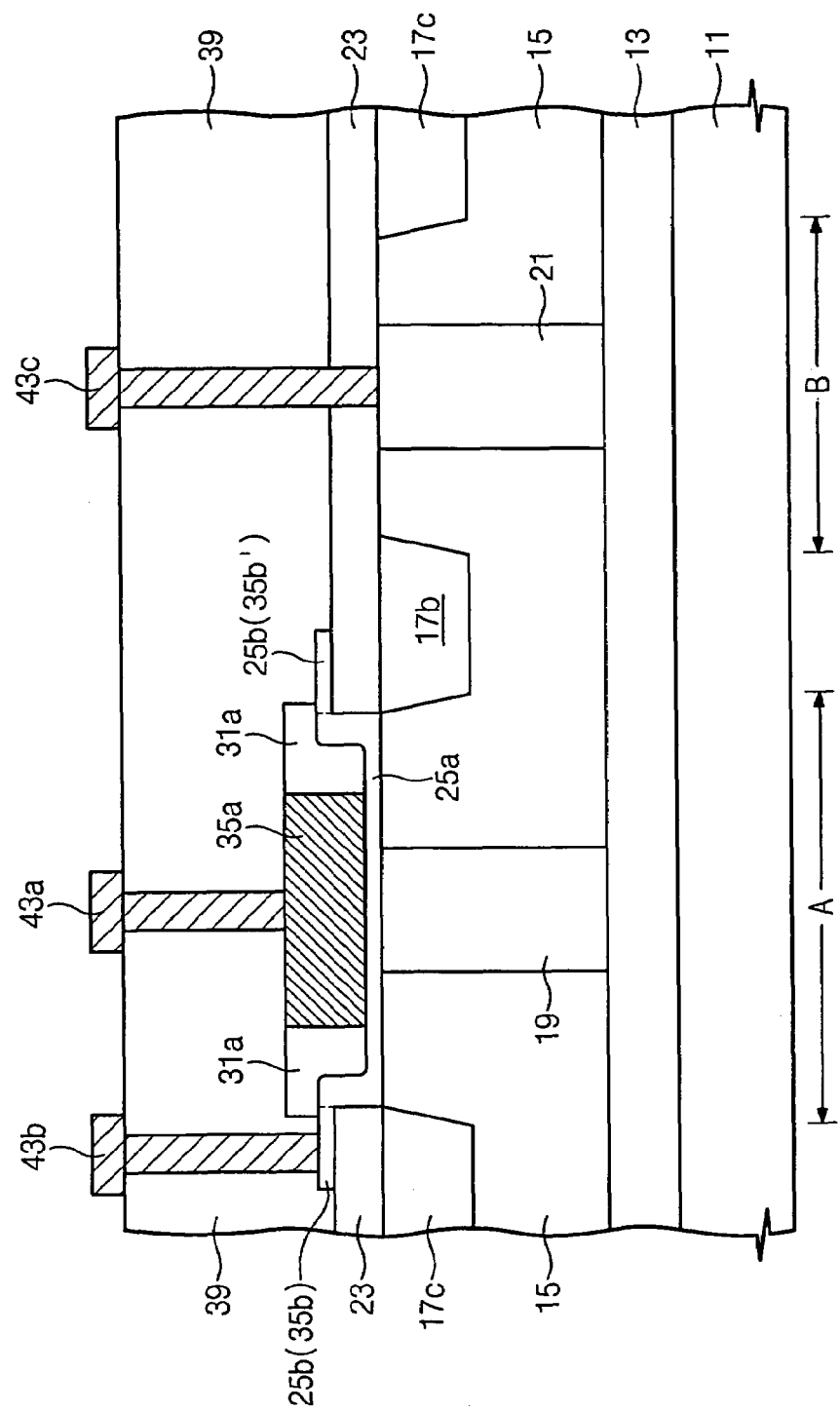

Referring to FIG. 22, insulating layer 31 and silicon-germanium layer 25b are patterned to expose a polycrystalline silicon-germanium layer 35b in which a base terminal will be formed. After an insulating interlayer 39 is deposited, a contact hole process and a line process are performed to form metal lines 43a, 43b and 43c.

As described above, at least the base contact and the emitter contact have substantially equal thickness due to the planarization process, thereby making it possible to form the emitter contact and base contact with low resistance. Also, the silicide layer can be stably formed between the metal lines, thereby providing high-speed bipolar transistors.

The foregoing preferred embodiments are teaching examples. Those of ordinary skill in the art will understand that various changes in form and details may be made to the exemplary embodiments without departing from the scope of the present invention as defined by the following claims.

What is claimed is:

1. A semiconductor device comprising:
   an n-type semiconductor layer;
   a p-type semiconductor layer formed on the n-type semiconductor layer; and an insulating layer formed on the p-type semiconductor layer, the insulating layer having a first contact window and a second contact window exposing the p-type semiconductor layer;

a first semiconductor pattern filling the first contact window and a second semiconductor pattern filling the second contact window, wherein the first and second semiconductor patterns are both formed apart from each other on the p-type semiconductor layer, wherein a height of the first semiconductor pattern is substantially equal to a height of the second semiconductor pattern, and wherein the first semiconductor pattern is an n-type semiconductor pattern and the second semiconductor pattern is a p-type semiconductor pattern.

2. The semiconductor device of claim 1, wherein the n-type semiconductor layer comprises a single-crystalline silicon layer doped with n-type impurities and constituting a part of a collector for a bipolar transistor.

3. The semiconductor device of claim 2, wherein the p-type semiconductor layer forms a base for the bipolar transistor and comprises a single-crystalline silicon-germanium layer doped with p-type impurities;

wherein the first semiconductor pattern contacts the p-type semiconductor layer and forms an emitter terminal for the bipolar transistor; and, the second semiconductor pattern contacts the p-type semiconductor layer and forms a base electrode for the bipolar transistor.

4. The semiconductor device of claim 3, wherein the first semiconductor pattern comprises polysilicon doped with n-type dopant ions, and the second semiconductor pattern comprises polysilicon doped with p-type dopant ions.

5. The semiconductor device of claim 3, further comprising:

a first silicide layer formed on a surface of the first semiconductor pattern;

a second silicide layer formed on a surface of the second semiconductor pattern; and a third silicide layer formed on a surface of the n-type semiconductor layer.

6. The semiconductor device of claim 1, further comprising a third semiconductor pattern formed on the n-type semiconductor layer, wherein the third semiconductor pattern has a height substantially equal to the heights of the first and second semiconductor patterns, and wherein the third semiconductor pattern is an n-type semiconductor pattern.

7. The semiconductor device of claim 6, wherein the first and third semiconductor patterns comprise polysilicon doped with n-type dopant ions, and the second semiconductor pattern comprises polysilicon doped with p-type dopant ions.

8. A bipolar transistor comprising:

a first semiconductor layer having a first conductivity type and forming a collector;

a second semiconductor layer having a second conductivity type and formed over the first semiconductor layer, the second semiconductor layer forming a base;

an insulating layer formed on the second semiconductor layer, the insulating layer having first, second, and third contact windows exposing the second semiconductor layer;

a first semiconductor pattern having the first conductivity type filling the first contact window and forming an emitter terminal;

a second semiconductor pattern having the second conductivity type filling the second contact window and forming a base terminal; and a third semiconductor pattern having the first conductivity type and filling the third contact window to form a collector terminal, wherein the insulating layer has a flat top surface and is formed on the second semiconductor layer.

9. The bipolar transistor of claim 8, further comprising:

a first silicide layer formed on the first semiconductor pattern;

a second silicide layer formed on the second semiconductor pattern; and a third silicide layer formed on the third semiconductor pattern.

10. A bipolar transistor comprising:

a first semiconductor layer having a first conductivity type and forming a collector;

a second semiconductor layer having a second conductivity type and formed over the first semiconductor layer, the second semiconductor layer forming a base;

an insulating layer formed on the second semiconductor layer, the insulating layer having a first contact window and a second contact window exposing the second semiconductor layer;

a first semiconductor pattern having the first conductivity type filling the first contact window and forming an emitter terminal;

a second semiconductor pattern having the second conductivity type filling the second contact window and forming a base terminal;

a first silicide layer formed on a surface of the first semiconductor pattern;

a second silicide layer formed on a surface of the second semiconductor pattern; and a third silicide layer formed on the second semiconductor layer.

11. A bipolar transistor comprising:

a first semiconductor layer having a first conductivity type and forming a collector;

a second semiconductor layer having a second conductivity type and formed over the first semiconductor layer, the second semiconductor layer forming a base;

an insulating layer formed on the second semiconductor layer, the insulating layer having a first contact window and a second contact window exposing the second semiconductor layer;

a first semiconductor pattern having the first conductivity type filling the first contact window and forming an emitter terminal; and a second semiconductor pattern having the second conductivity type filling the second contact window and forming a base terminal, wherein the insulating layer comprises an oxide layer and a nitride layer stacked in sequence.

12. A bipolar transistor comprising:

a p-type silicon substrate;

a heavily-doped n-type sub-collector region formed on the p-type silicon substrate;

a slightly-doped n-type single-crystalline silicon layer formed on the sub-collector region;

a device isolation layer formed in the slightly-doped n-type single-crystalline silicon layer to define a base-emitter region and a collector contact region;

first and second low-resistance collector regions formed by implanting n-type dopant ions into the slightly-doped n-type silicon layer in the base-emitter region and the collector contact region, respectively, the first and second low-resistance collector regions being connected to the sub-collector region;

a p-type silicon-germanium layer formed on the slightly-doped n-type single-crystalline silicon layer in the base-emitter region and serving as a base;

an insulating layer formed on the p-type silicon-germanium layer, the insulating layer comprising a first contact window disposed on the first low-resistance collector region and a second contact window spaced apart from the first contact window; and an n-type polysilicon pattern filling the first contact window and forming an emitter electrode, and a p-type polysilicon pattern filling the second contact window and forming a base terminal.

13. The bipolar transistor of claim 12, further comprising:
a first silicide layer formed on the second low-resistance collector region;
a second silicide layer formed on the n-type polysilicon pattern; and
a third silicide layer formed on the p-type polysilicon layer.

14. The bipolar transistor of claim 12, further comprising a passivation layer formed on the slightly-doped n-type single-crystalline silicon layer and below the insulating layer and having a gap exposing the slightly-doped n-type single-crystalline silicon layer over the base-emitter region.

15. The bipolar transistor of claim 12, wherein the passivation layer comprises a silicon oxide layer, and the insulating layer comprises an oxide layer and a nitride layer stacked in sequence.

16. The bipolar transistor of claim 12, further comprising:
an n-type silicon-germanium layer having a flat top surface and formed on the slightly-doped n-type single-crystalline silicon layer below the insulating layer;
a third contact window formed in the insulating layer; and,
an additional n-type polysilicon pattern filling the third contact window.

17. The bipolar transistor of claim 16, further comprising:
first, second, and third silicide layers respectively formed on the n-type polysilicon pattern, the p-type polysilicon pattern, and the additional n-type polysilicon pattern.

* * * * *